United States Patent
Cernea

(10) Patent No.: US 11,087,850 B2
(45) Date of Patent: *Aug. 10, 2021

(54) SENSING IN FLOATING-SOURCE MEMORY ARCHITECTURE

(71) Applicant: Sunrise Memory Corporation, Fremont, CA (US)

(72) Inventor: Raul Adrian Cernea, Santa Clara, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/862,389

(22) Filed: Apr. 29, 2020

(65) Prior Publication Data

US 2020/0258581 A1 Aug. 13, 2020

Related U.S. Application Data

(63) Continuation of application No. 16/193,292, filed on Nov. 16, 2018, now Pat. No. 10,672,484.

(60) Provisional application No. 62/588,109, filed on Nov. 17, 2017.

(51) Int. Cl.
| | | |
|---|---|---|
| *G11C 16/04* | (2006.01) | |
| *G11C 16/26* | (2006.01) | |
| *G11C 16/24* | (2006.01) | |
| *G11C 16/32* | (2006.01) | |
| *H01L 27/11582* | (2017.01) | |
| *G11C 16/08* | (2006.01) | |
| *G11C 7/06* | (2006.01) | |
| *G11C 7/12* | (2006.01) | |

(52) U.S. Cl.
CPC ........... *G11C 16/26* (2013.01); *G11C 7/06* (2013.01); *G11C 7/12* (2013.01); *G11C 16/0483* (2013.01); *G11C 16/08* (2013.01); *G11C 16/24* (2013.01); *G11C 16/32* (2013.01); *H01L 27/11582* (2013.01); *G11C 2207/002* (2013.01)

(58) Field of Classification Search
CPC ......... G11C 7/06; G11C 7/12; G11C 16/0483; G11C 16/08; G11C 16/24; G11C 16/32; G11C 2207/002; H01L 27/11582
USPC ..................................................... 365/185.17
See application file for complete search history.

(56) References Cited

U.S. PATENT DOCUMENTS

| | | | |
|---|---|---|---|
| 7,236,403 B2 | 6/2007 | Deml et al. | |
| 7,940,573 B2 | 5/2011 | Masuoka et al. | |
| 9,082,500 B1 | 7/2015 | Ku | |
| 10,672,484 B2 * | 6/2020 | Cernea | H01L 27/11582 |
| 2017/0148517 A1 * | 5/2017 | Harari | G11C 11/5635 |

OTHER PUBLICATIONS

"PCT Search Report and Written Opinion, PCT/US2018/061495", dated Feb. 4, 2019.

* cited by examiner

*Primary Examiner* — Huan Hoang
(74) *Attorney, Agent, or Firm* — Edward C. Kwok; VLP Law Group, LLP

(57) ABSTRACT

Algorithms for fast data retrieval, low power consumption in a 3D or planar non-volatile array of memory cells, connected between an accessible drain string and a floating, not directly accessible, source string, in a NOR-logic type of architecture, are presented.

20 Claims, 24 Drawing Sheets

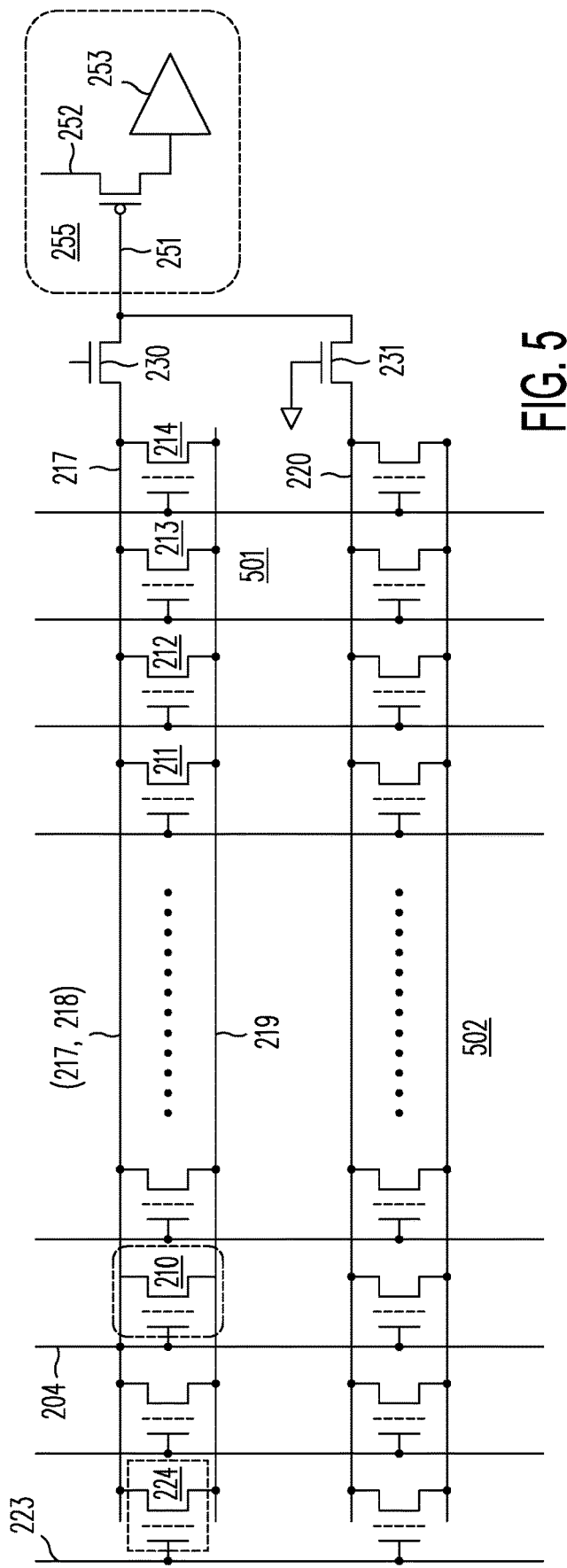
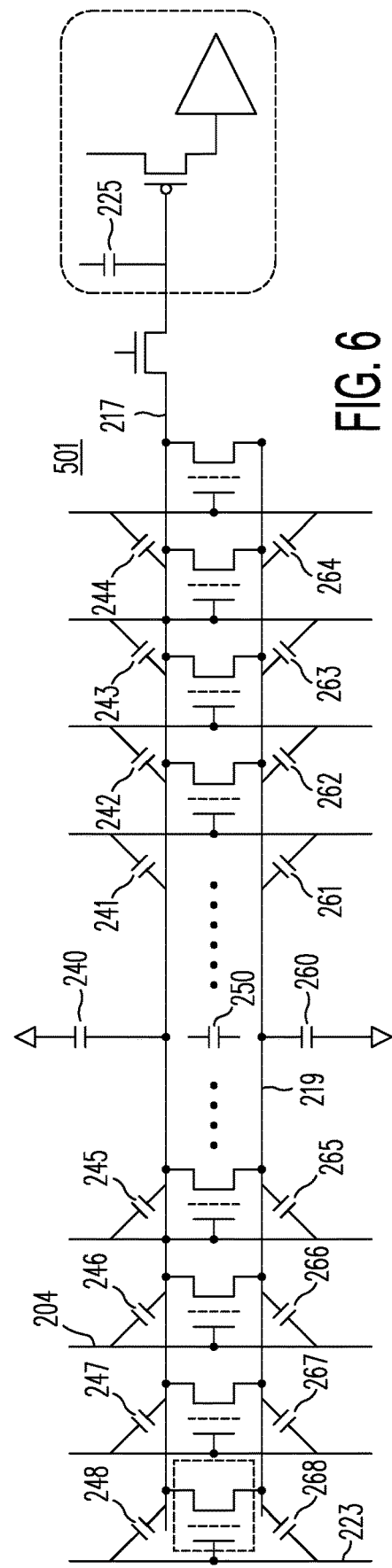
FIG. 5
FIG. 6

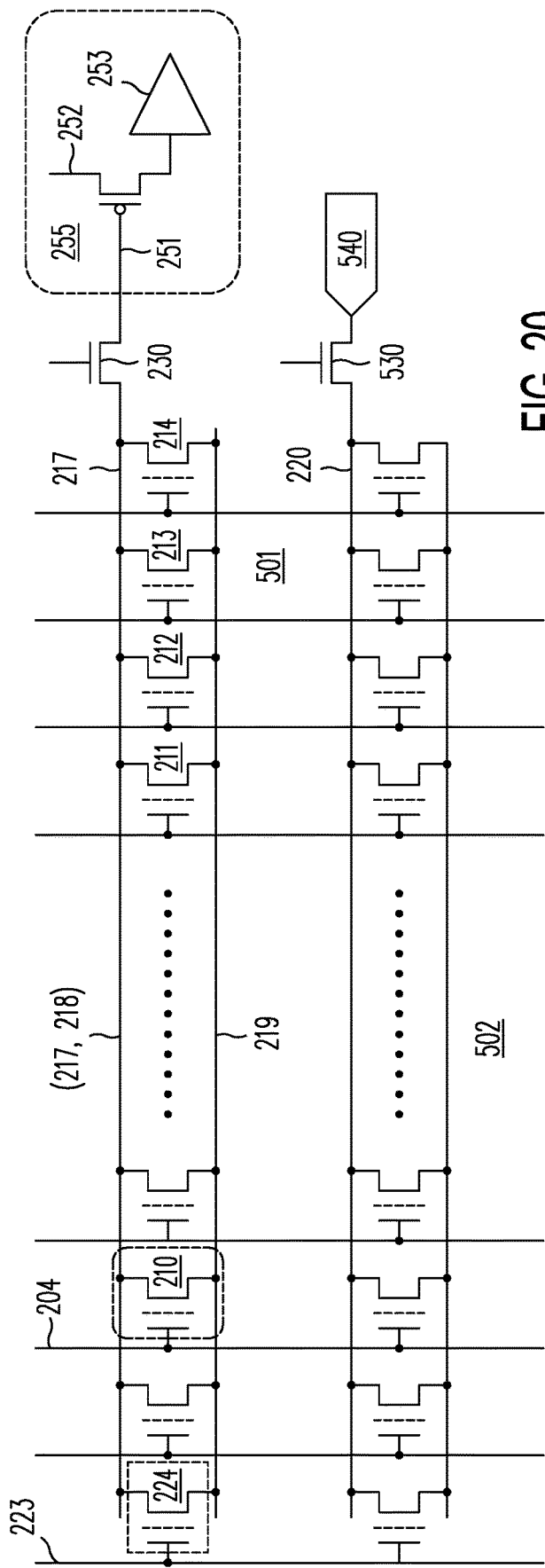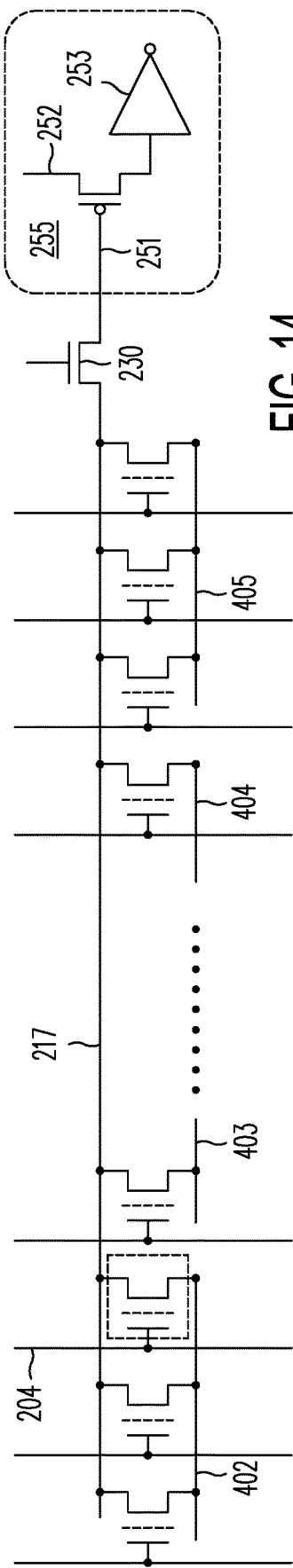
FIG. 20
FIG. 14

US 11,087,850 B2

SENSING IN FLOATING-SOURCE MEMORY ARCHITECTURE

CROSS REFERENCE TO RELATED APPLICATIONS

The present invention is a continuation application of U.S. patent application ("Parent application"), Ser. No. 16/193,292, entitled "SENSING IN FLOATING-SOURCE MEMORY ARCHITECTURE," filed on Nov. 16, 2018, which relates to and claims priority of U.S. provisional application ("Provisional application"), Ser. No. 62/588,109, filed on Nov. 17, 2017. The disclosures of the Parent Application and the Provisional application are hereby incorporated by reference their entireties.

BACKGROUND OF THE INVENTION

1. Field of the Invention

The present invention relates to a three-dimensional, non-volatile memory structure of memory cells organized as NOR-type memory strings. More particularly, the present invention relates to data retrieval from a structure of such memory cells in which each memory cell is connected between a directly accessible drain electrode and a floating—but not directly accessible—source electrode.

2. Discussion of the Related Art

Non-volatile memory cells are often connected either serially (NAND) or in parallel (NOR) between two externally accessible electrical nodes ("electrodes"). In contrast to dynamic random-access memory (DRAM) cells, non-volatile memory cells retain their stored information after an access for data retrieval, or over a period during which power is removed. In a typical non-volatile memory cell, data is stored in an isolated charge-trapping layer in the form of injected electric charge that is created by, for example, Fowler-Nordheim tunneling. The stored information is typically retrieved using a non-destructive method that is based on either a measurable current flow, or a measurable change in voltage level. The result of the measurement is typically provided in the form of digital information by a "sense amplifier." The current flow method is called "current-sensing," while the voltage change method is called "voltage-sensing." From this perspective, a sense amplifier is a digital ammeter, when used for current sensing, or a digital voltmeter, when used for voltage-sensing.

FIG. 1A shows a sense amplifier circuit, described in U.S. Pat. No. 7,046,568, that is capable of both current-sensing and voltage-sensing. FIG. 1B illustrates a simplified sense amplifier circuit, based on the sense amplifier circuit of FIG. 1A, operating under the current-sensing mode. As shown in FIGS. 1A and 1B, memory cell 100 is connected between bit line (BL) 101, which is heavily loaded with parasitic capacitance (represented by capacitor 102 of FIG. 1B), and the ground reference. NMOS transistors 103 and 104 are connected in a cascode configuration to bias memory cell 100 to a time-independent drain voltage, thereby keeping the current in memory cell 100 constant, independent of the potential at node 106 (signal SEN). FIG. 1C shows voltage waveforms for various signals in the current-sensing operation of FIG. 1B. As shown in FIGS. 1B and 1C, node 106 is initialized to power supply voltage VDD by PMOS initialization transistor 105, so that level-sensitive PMOS transistor 110 is non-conducting, and bit line 101 is held at voltage $BLC-V_T$, where voltage BLC is the voltage at the gate electrode of NMOS transistor 103 and $V_T$ is the threshold voltage of NMOS transistor 103. Capacitor 107—which may be a dedicated capacitor (i.e., an expressly provided capacitor, not a parasitic capacitor) with a smaller capacitance relative to parasitic bit line capacitor 102—is connected between node 106 and power supply voltage VDD. At time $T_1$, initialization transistor 105 is turned OFF and memory cell 100—depending upon its conductive state—may or may not discharge capacitor 107. If memory cell 100 is not conductive, node 106 does not lose any charge and remains at its initial voltage VDD, so that PMOS transistor 110 is non-conducting. In this case, output electrode 111 of one of the coupled inverters remains at ground level. However, if memory cell 100 is conductive, the voltage on node 106 decreases. At time $T_2$, when the voltage at node 106 decreases below "trip point" (TP) level 117, PMOS transistor 110 becomes conducting, driving output electrode 111 to supply voltage VDD.

Capacitor 107 performs two roles—i.e., as a noise filter and as a cell current evaluation device (through time integration). A constant current in the memory cell discharges capacitor 107 linearly (over time) towards TP level 117. As illustrated in FIG. 1C, different cell currents result in the voltage of node 106 having different slopes 113 and 114, with the steeper slope—indicated by waveform 114—corresponding to a higher discharge current. The voltage at output electrode 111 changes logic state, as illustrated by waveforms 115 and 116 (corresponding to slopes 113 and 114, respectively), when the voltage on node 106 crosses TP level 117. TP level 117 corresponds to the threshold voltage of PMOS transistor 110.

In FIG. 1B, additional transistor 108 has voltage BLX at its gate electrode, which is higher than voltage BLC at NMOS transistor 103, and supply voltage VDD at its drain electrode. Transistor 108 maintains the voltage at the drain electrode of transistor 103. This is because, as the voltage at node 106 decreases, the drain electrode of transistor 103 is held at voltage $BLX-V_T$, which is higher than voltage $BLC-V_T$ at bit line 191, thereby ensuring that the voltage at bit line BL 101 remains constant at $BLC-V_T$. Discharge time window 118, spanning the time period between $T_1$ and $T_4$, is calibrated in advance of the current-sensing operation, so as to provide discharge linearity at node 106 between supply voltage VDD and TP level 117. Below TP level 117, linearity may be lost, due to the overall circuit response. The circuit response includes transistor 110 becoming conducting and the voltage at the drain electrode of transistor 103 being held at $BLX-V_T$ without affecting accuracy. This operation of FIGS. 1B and 1C illustrates merely one type of current sensing operations. Alternatively, the cell current can also be assessed by mirroring the current and comparing it to a known reference.

FIG. 1D illustrates a simplified sense amplifier circuit, based on the sense amplifier circuit of FIG. 1A, operating under voltage-sensing mode. FIG. 1E shows voltage waveforms for various signals in the current-sensing operation of FIG. 1D. As shown in FIG. 1D, with its gate electrode at voltage $BLC_1$, transistors 103 pre-charges bit line 101 (a capacitive node, as indicated by capacitor 102) from ground to voltage $BLC_1-V_T$ (as illustrated by waveform 119 in FIG. 1E). The voltage at the gate electrode of transistor 103 is then lowered to voltage $BLC_2$ value (indicated by waveform 120), thereby disconnecting bit line 101 from node 106. At time $T_1$, a read voltage is applied to memory cell 100. Depending on its encoded state, activating memory cell 100 may or may not discharge bit line 101. The rate of discharge at bit line 101 may be significantly lower (e.g., orders of magnitude) relative to the "current-sensing" operations above, as capacitor 102 could be orders of magnitudes greater than capacitor 107 discussed above. Unlike current-sensing, the voltage-sensing operation does not require a dedicated capacitor 107. As shown in FIG. 1E, when the voltage at bit line 101 decreases below $BLC_2-V_T$ (i.e., voltage level 120), node 106 is immediately pulled down (indicated in FIG. 1E by reference numeral 121). Eventually, bit line 101 discharges to ground. A major disadvantage of the voltage-sensing method is that it is time-consuming.

Neither the current-sensing method nor the voltage-sensing method can be used when the source electrode of memory cell 100 is not grounded, as memory cell 100 would not be able to act as an active pull-down to ground. There is no current flow to ground that can coerce a capacitive input terminal of a sense amplifier to cross a discrimination point through an intermediate circuit.

SUMMARY

According to one embodiment of the present invention, a method retrieves stored information from a selected memory cell in a string of memory cells. In that embodiment, all memory cells in the string share a common bit line, some of the memory cells are associated with a common source line, while the other memory cells are each associated other common source lines. Each memory cell in the memory string is associated with a different word line. The method includes (a) initializing the common bit line and the associated common source line of a memory cell to a predetermined voltage between a power supply voltage and ground; (b) effectuating a voltage separation between the associated common source line and the common bit line by causing the common bit line, the associated common source line, or both, to deviate from the predetermined voltage; (c) on the associated word line, providing a read voltage to place the memory cell in a conductive state that corresponds to the information stored in the memory cell; and (d) using a sense circuit, determining the conductive state based on sensing a flow of charge into or out of the associated common source line as a result of the read voltage on the associated word line.

The present invention is better understood upon consideration of the detailed description below, in conjunction with the accompanying drawings.

BRIEF DESCRIPTION OF THE DRAWINGS

FIG. 5 shows a schematic circuit for memory cells in NOR strings 501 and 501 formed by two active strips sharing sense amplifier 255, according to one embodiment of the present invention.

FIG. 6 shows NOR string 501 with parasitic capacitors indicated, according to one embodiment of the present invention.

FIG. 14 illustrates dividing a common source line into segments (e.g., source segments 402, 403, 404, and 405) to mitigate sub-threshold leakage effects in a long memory string.

FIG. 20 illustrates using the parasitic capacitance between two vertically adjacent NOR strings 501 and 502 to induce a coupled voltage step or pulse in one of the floating common source lines.

DETAILED DESCRIPTION OF THE PREFERRED EMBODIMENTS

In an isolated system, charge trapped inside the system is conserved under a sensing operation. For example, in a memory cell that is not connected to a ground node, the charge in the memory cell cannot be discharged to "0" under voltage-sensing, nor could the memory cell provide a constant current for measurement under current-sensing. The present invention provides a "charge-sensing" method for such a memory cell based upon a principle of charge sharing.

A charge-sensing method of the present invention may be applicable to sensing memory cells in the NOR strings disclosed, for example, in U.S. patent application ("Non-Provisional application I"), Ser. No. 15/220,375, entitled "Multi-Gate NOR Flash Thin-film Transistor Strings Arranged in Stacked Horizontal Active Strips with Vertical Control Gates," filed Jul. 26, 2016. Such a charge-sensing method of the present invention may also be applicable to sensing memory cells in the NOR strings disclosed, for example, in U.S. patent application ("Non-Provisional application II"), Ser. No. 15/248,420, entitled "Capacitive-Coupled Non-Volatile Thin-Film Transistor Strings in Three-Dimensional Arrays," filed on Aug. 26, 2017. In each of these examples, a method of the present invention may be used to evaluate the result of a charge-sharing operation between a floating source electrode of a memory cell, accessed through the floating drain electrode of the memory cell, and a floating input electrode of a sense amplifier. The conductive state of the memory cell is determined from the result of the evaluation—i.e., a determination a voltage balance between the source electrode of the memory cell and the input electrode of the sense amplifier. If the conductive state of the memory cell is non-conducting, the potentials between the nodes is not equalized. Otherwise, if the conductive state of the memory cell is conducting, the potentials between the nodes equalize.

Figure 1A:
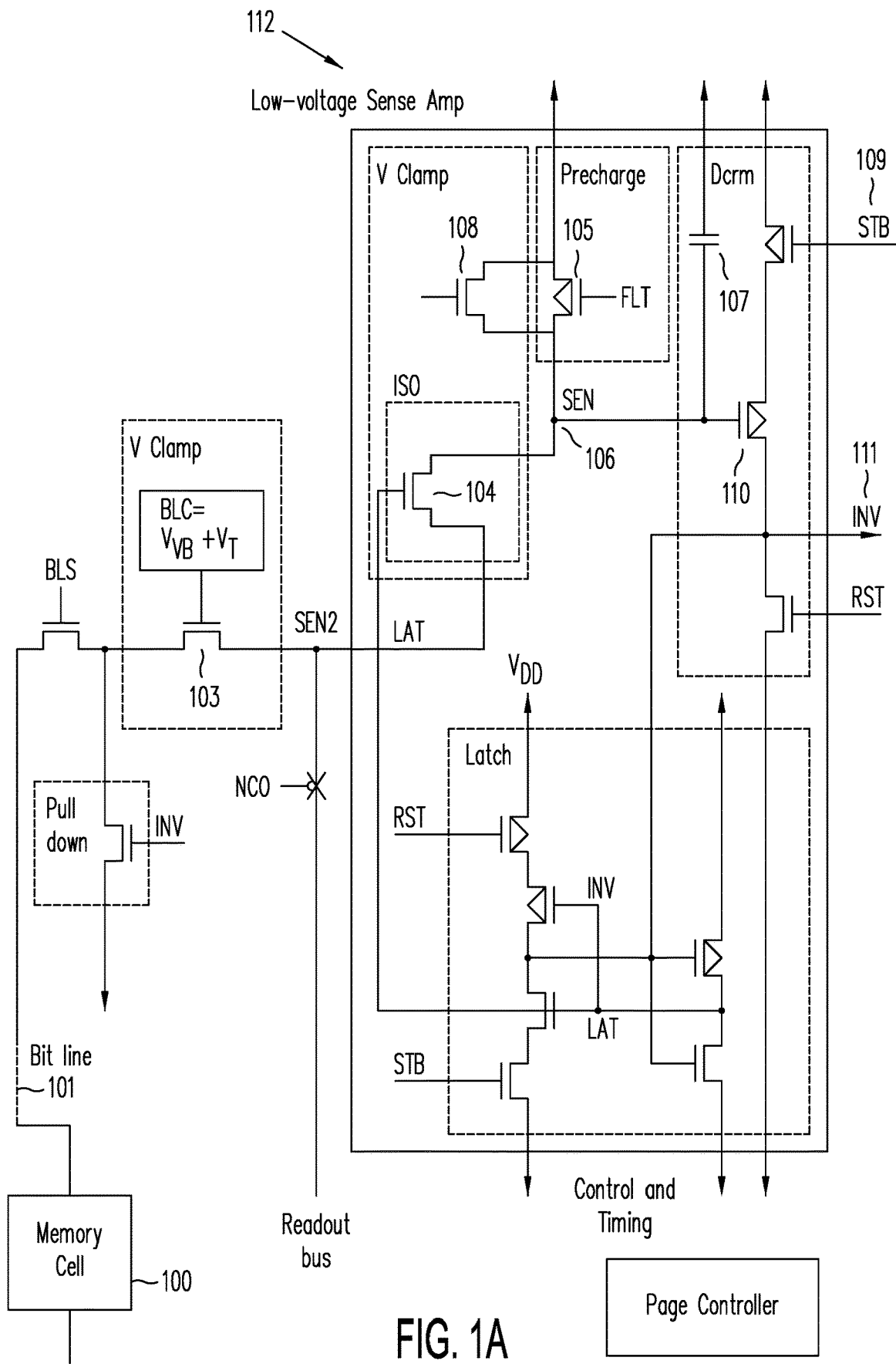
FIG. 1A shows a sense amplifier circuit capable of both current-sensing and voltage-sensing operations.
Figure 1B:
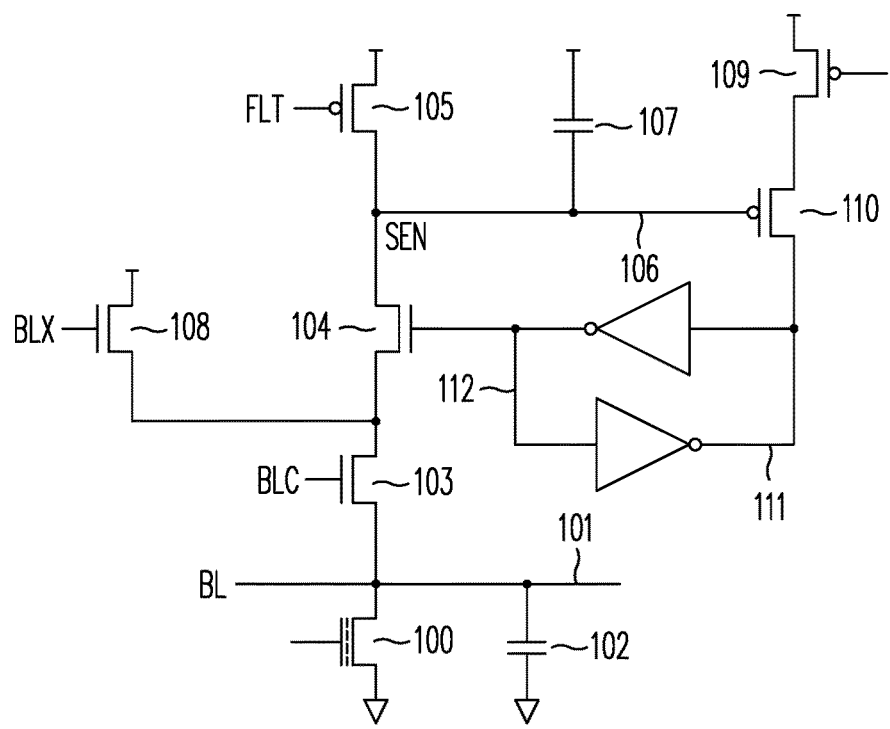
FIG. 1B illustrates a simplified sense amplifier circuit, based on the sense amplifier circuit of FIG. 1A, operating under the current-sensing mode.
Figure 1D:
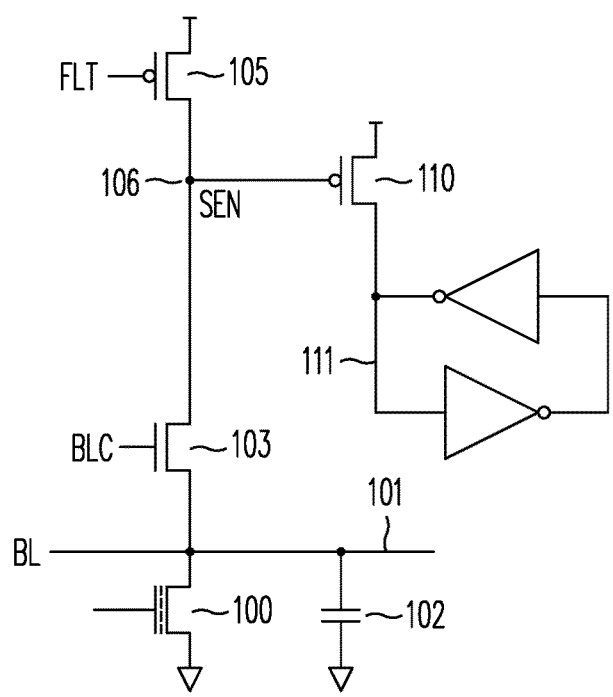
FIG. 1D illustrates a simplified sense amplifier circuit, based on the sense amplifier circuit of FIG. 1A, operating under voltage-sensing mode.
Figure 1C:
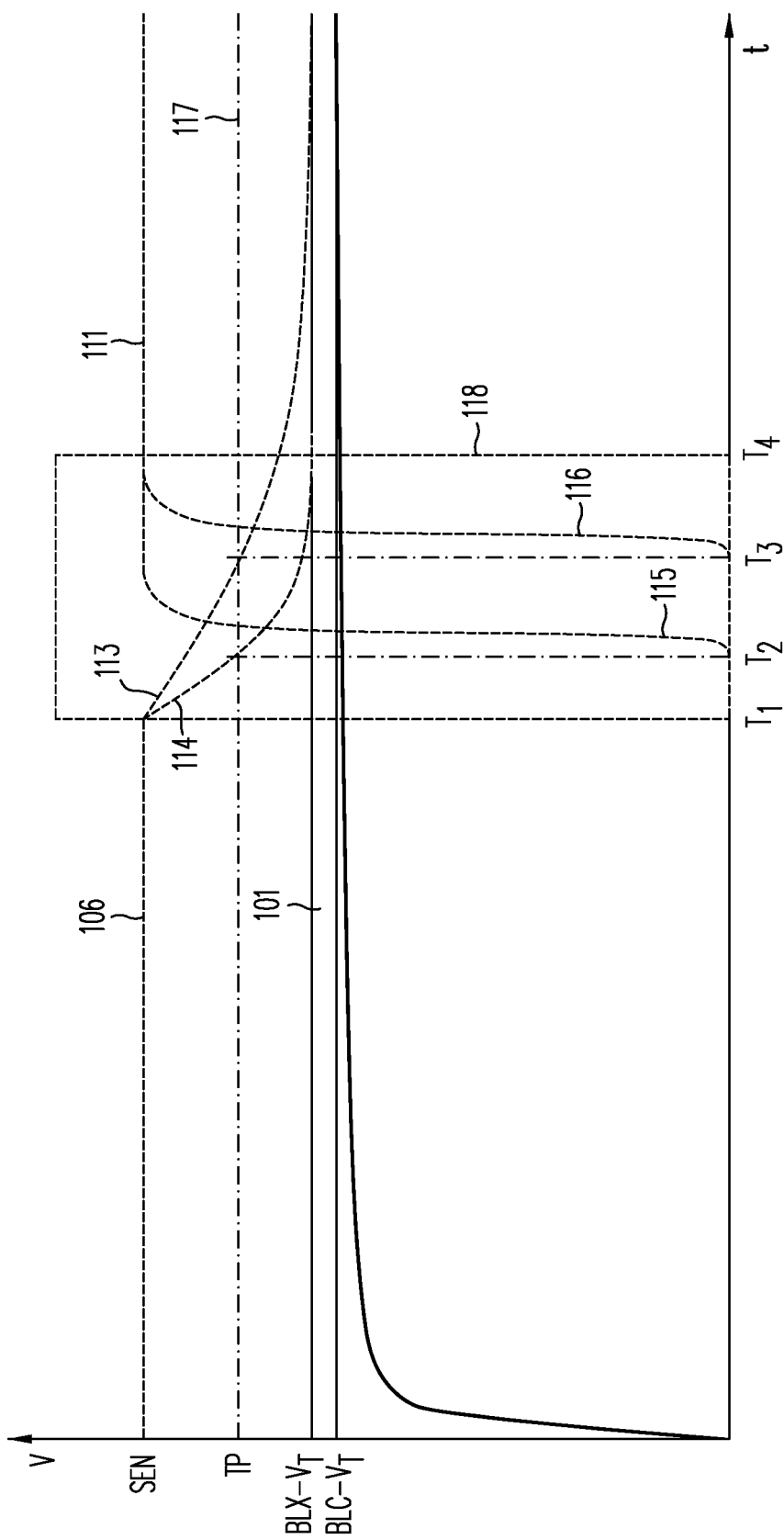
FIG. 1C shows voltage waveforms for various signals in the current-sensing operation of FIG. 1B.
Figure 1E:
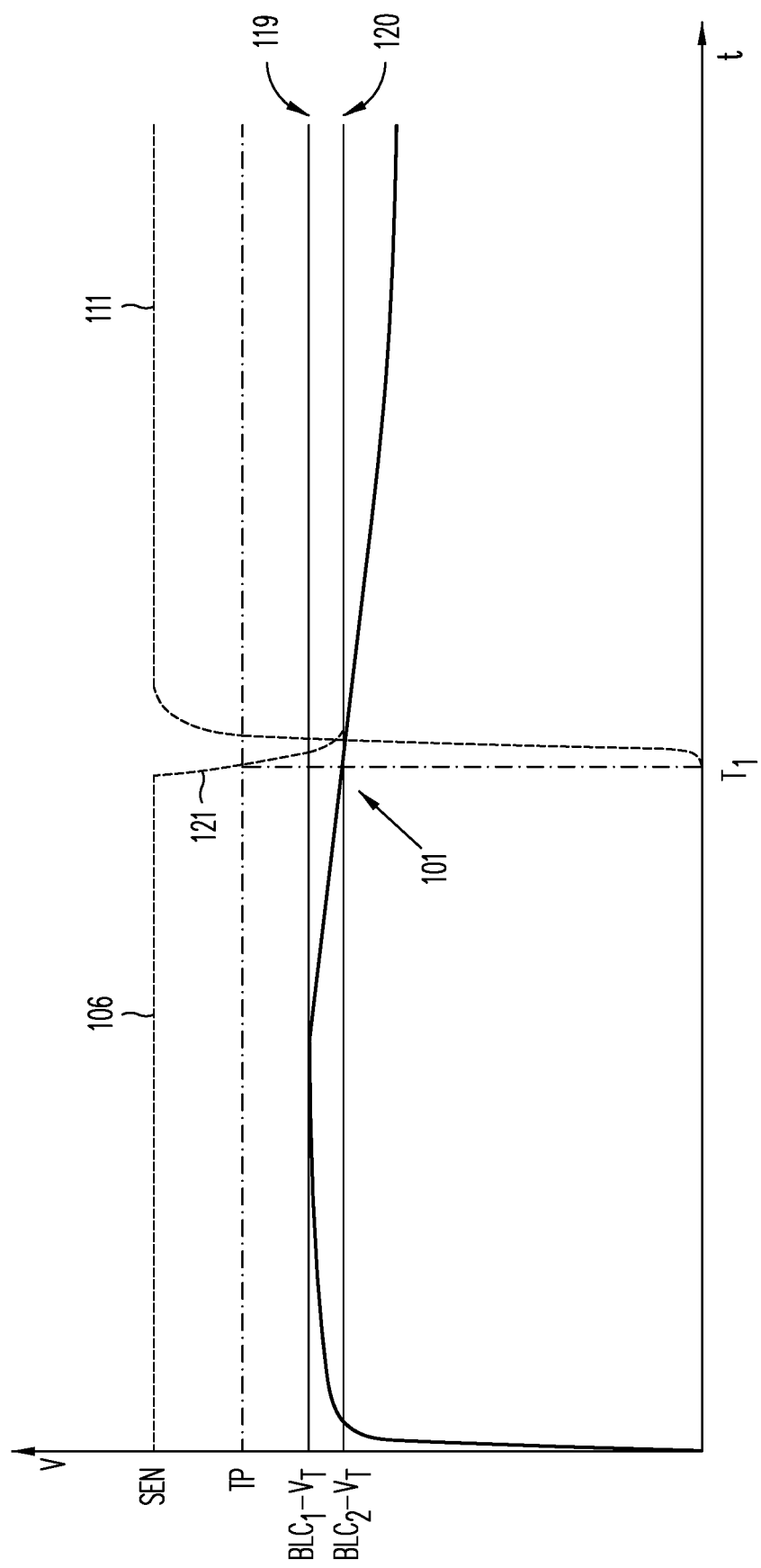
FIG. 1E shows voltage waveforms for various signals in the voltage-sensing operation of FIG. 1D.
Figure 2A:
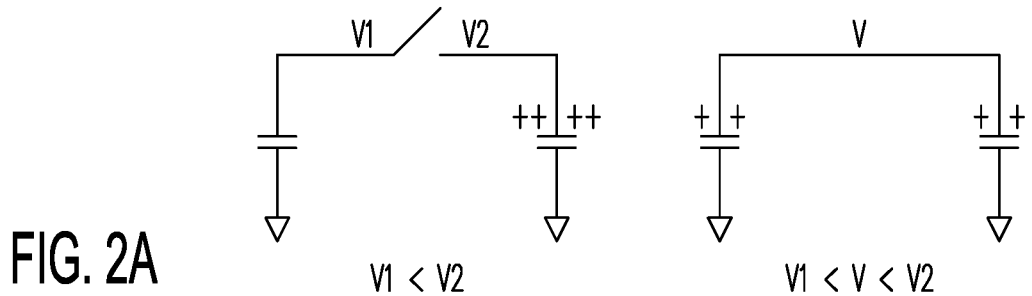
FIG. 2A illustrates the principle of charge-sensing according to one embodiment of the present invention.
Figure 2B:
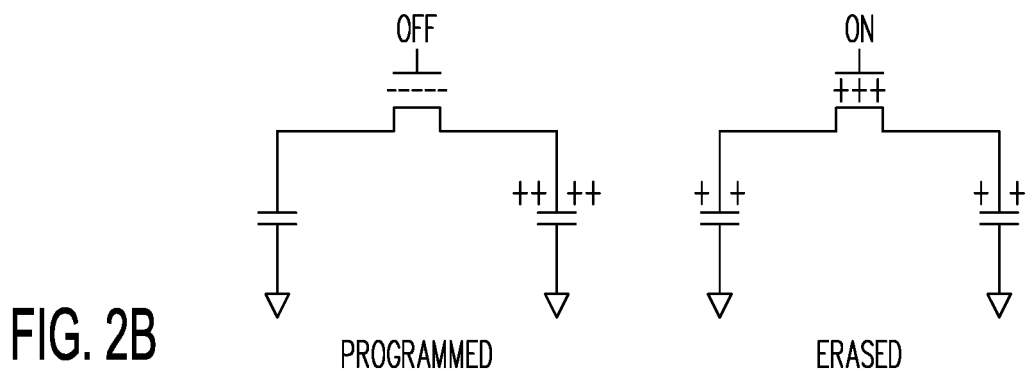
FIG. 2B illustrates applying the principle of charge-sensing to evaluate the conductive state of a memory cell, according to one embodiment of the present invention.

The principle of charge-sensing in a method of the present invention is illustrated in FIG. 2A. As shown in FIG. 2A, two capacitors that are initialized to two different voltages, V1 and V2, will hold the voltages on their floating plates, so long as the floating plates are not connected. Depending upon their respective capacitances and the voltages across across these capacitors, these capacitors will also store two different amounts of electric charge. When connected, however, the amount of charge held in the two capacitors will remain the sum of their respective pre-connection charge amounts, but the voltages across their respective plates will equalize to a voltage between $V_1$ and V2. FIG. 2B illustrates applying the principle of charge-sensing to evaluate the conductive state of a memory cell, according to one embodiment of the present invention. As shown in FIG. 2B, in the non-conducting state ("programmed"), applying a read voltage to the gate electrode of the memory cell maintains the different voltages on its drain and source electrodes. However, in the conducting state ("erased"), applying the read voltage to the gate electrode results in equalizing the voltages on the drain and the source electrodes, as a result of redistributing their respective amounts of electric charge stored.

Figure 3A:
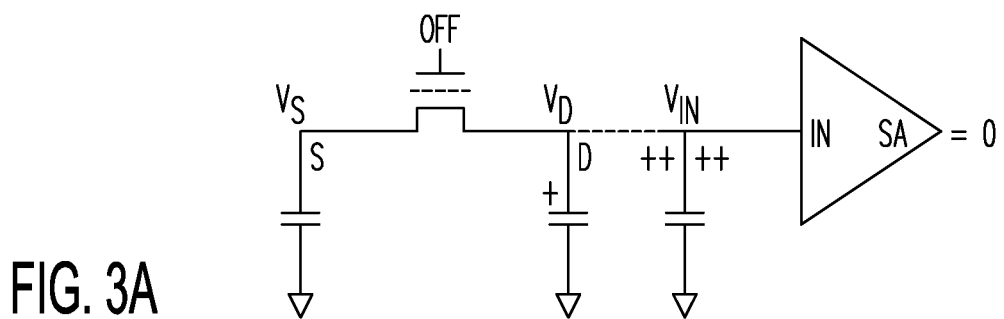
FIG. 3A illustrates evaluating charge-sharing on a memory cell in the non-conductive state using a sense amplifier circuit, according to one embodiment of the present invention.
Figure 3B:
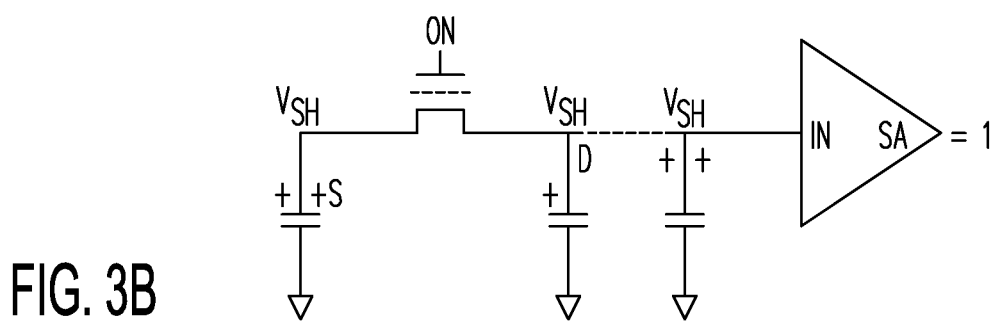
FIG. 3B illustrates evaluating charge-sharing on a memory cell in the conductive state using a sense amplifier circuit, according to one embodiment of the present invention.

Charge-sharing under a method of the present invention may be evaluated by connecting one of the nodes of the memory cell to a sense amplifier circuit, such as illustrated in FIGS. 3A and 3B. As shown in FIG. 3A, a memory cell having source electrode S and drain electrode D is connected to input electrode IN of sense amplifier SA through the memory cell's drain electrode D. The three capacitive nodes—S, D and IN—are initialized by supply nodes at voltages $V_S$, $V_D$ and $V_{IN}$, respectively, let's say, with voltage $V_S$ lower than voltage $V_{IN}$. These capacitive nodes are electrically charged and decoupled subsequently from their respective supply nodes. For example, although source node S cannot directly connect to a voltage supply, source node S can be charged through a conductive cell coupled to drain node D. As shown in FIG. 3A, the voltages on capacitive nodes S, D and IN may be maintained indefinitely (neglecting parasitic leakage), when the memory cell is in a non-conducting state ("OFF" or "programmed"). Conversely, when the memory cell is in a conducting state ("ON" or "erased"), as shown in FIG. 3B, source node S, drain node D and input node IN of the sense amplifier converge to a shared common voltage $V_{SH}$. Because the initial voltage $V_S$ on source node S was lower than voltage $V_{IN}$ on input node IN of the sense amplifier, the final voltage $V_{SH}$ is in-between $V_S$ and $V_{IN}$ (i.e., $V_S < V_{SH} < V_{IN}$). The sense amplifier circuit then converts the small analog voltage swing from $V_{IN}$ to $V_{SH}$ into a full CMOS digital voltage swing, if the small analog swing crosses a discrimination value.

Figure 4A:
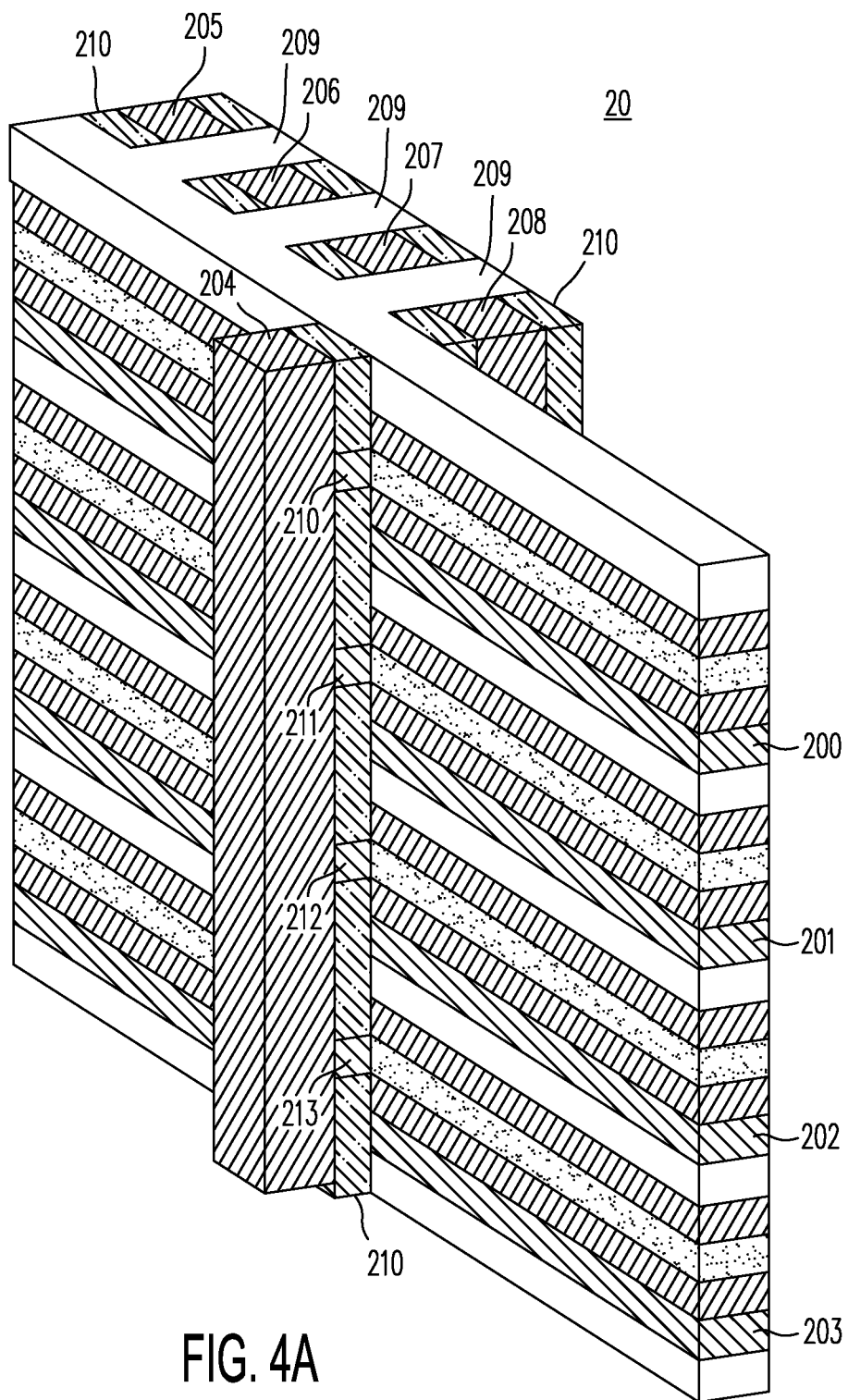
FIGS. 4A, 4B and 4C show, from different perspectives, 3-D non-volatile memory structure 20, according to one embodiment of the present invention.
Figure 4B:
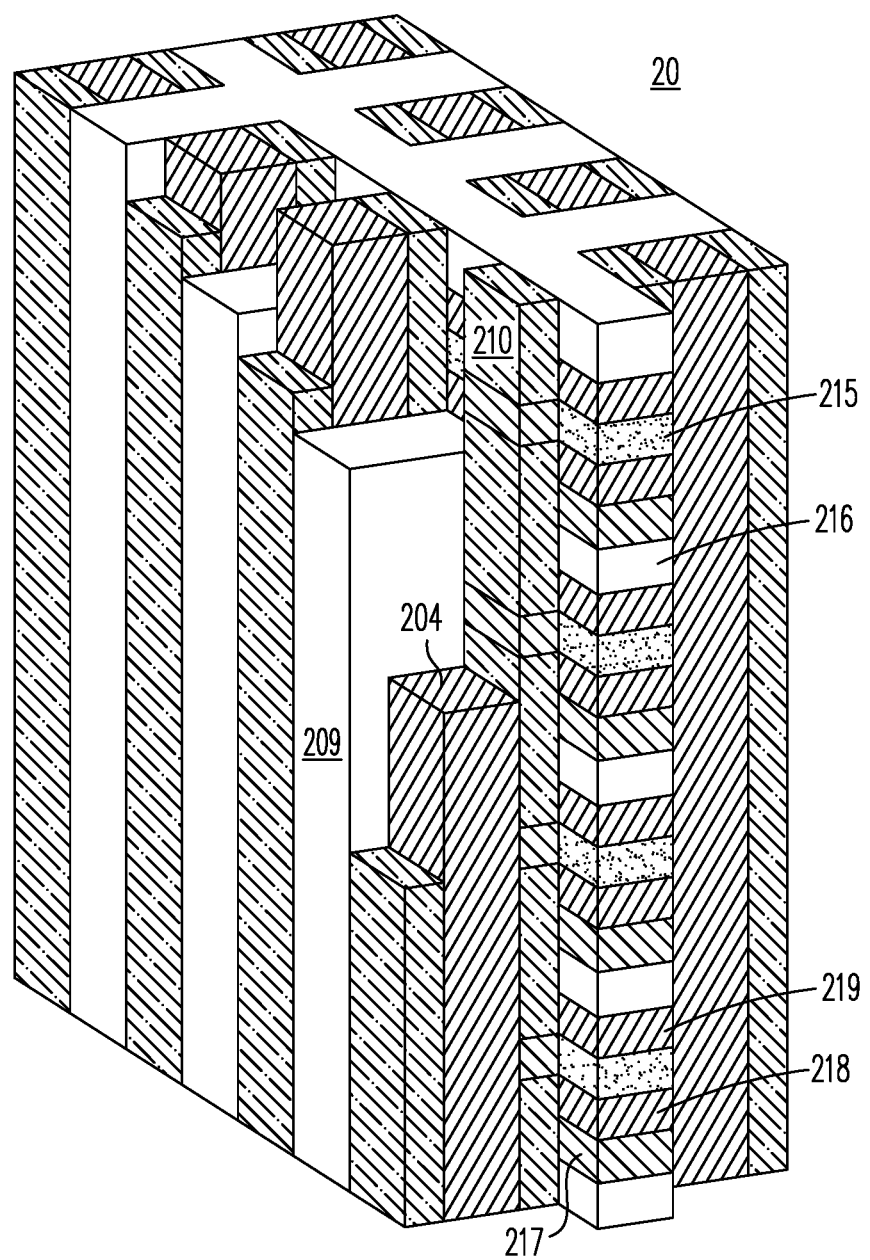
Figure 4C:
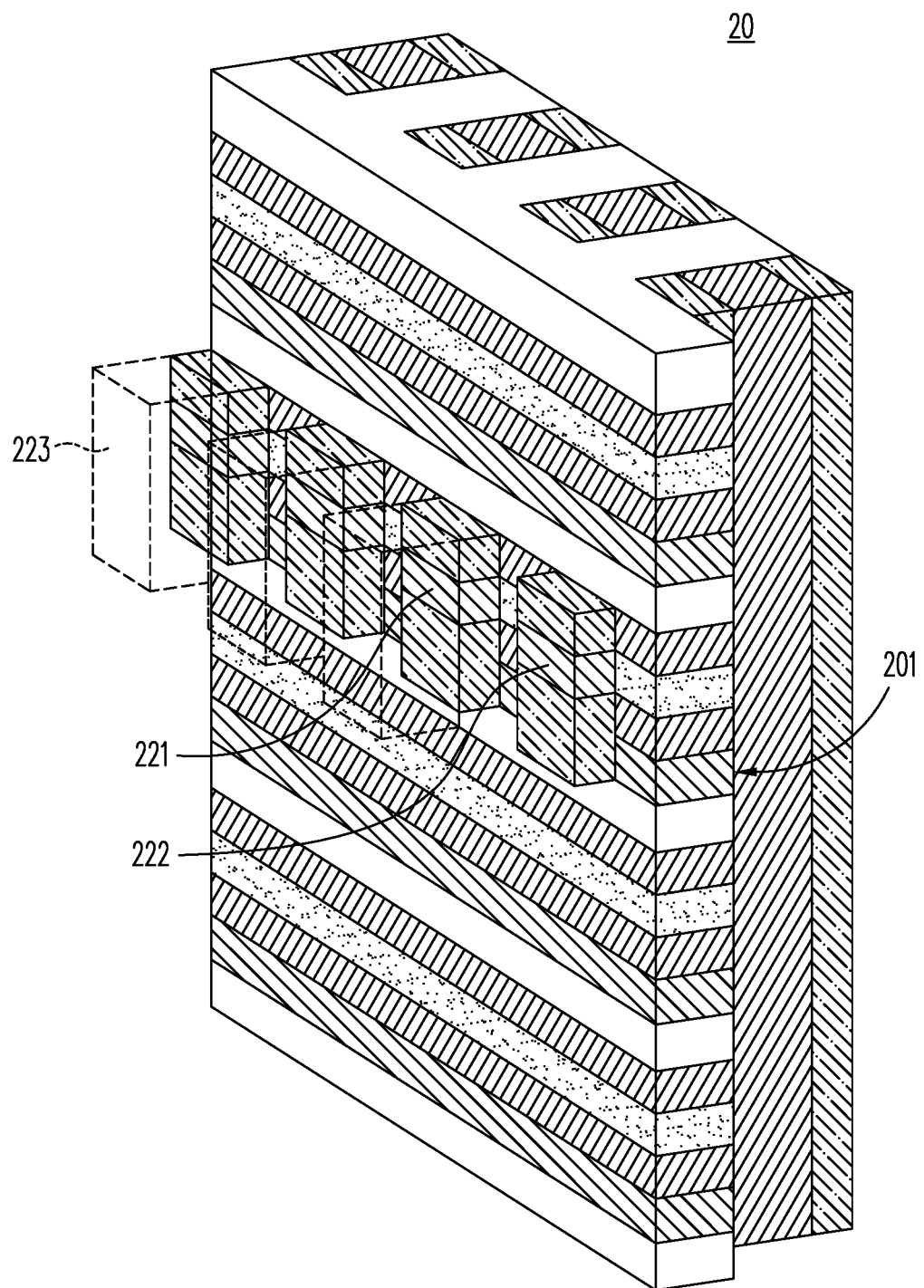

FIGS. 4A to 4C show, from different perspectives, 3-D non-volatile memory structure 20, according to one embodiment of the present invention. (Memory structure 20 provides an array of NOR strings, as disclosed in Non-Provisional applications I and II, for example.) As shown in FIG. 4A, memory structure 20 includes a stack of active strips. In FIG. 4A, between each adjacent pair of the reference numerals 200, 201, 202 and 203 is an active strip formed out of elongated layers of semiconductor and dielectric materials. On either side of the stack of active strips are provided vertical, local word lines, indicated in FIG. 4A by reference numerals 204, 205, 206, 207 and 208, with each word line being separated from another word line on the same side of the stack by a vertical column of dielectric material (e.g., dielectric column 209). The overlap between each local word line and each active strip (e.g., overlap portion 211, 212 or 213) is the location of a memory cell or storage transistor. A special layer of memory material, e.g., charge trapping layer 210, allows electric charge to be captured. The stored information is represented by the amount of electric charge captured, such as the presence or the absence of electric charge, in the single-bit per cell case, or the different quantities of electric charge, each representing a different stored value in a multiple-bit per cell case.

As shown in FIG. 4B, each active strip includes semiconductor layer 215 and dielectric layer 216, with semiconductor layer 215 being provided between conductive semiconductor layers 218 and 219. Conductive semiconductor layers 218 and 219 may be, for example, $N^+$ polysilicon. In FIG. 4B, additional conductive layer 217 (e.g., a metal), adjacent conductive semiconductor layer 218, may be provided to reduce resistance. In this example, the combination of metal layer 217 and its adjacent semiconductor layer 218 provides a common drain electrode for the associated memory cells, while conductive semiconductor layer 219 provides a common source electrode for the associated memory cells. Each common drain electrode is electrically connected to one or more circuits external to memory structure 20, while common source electrode is isolated from circuits external to memory structure 20. Semiconductor layer 215 provides a floating substrate for the memory cells. Semiconductor layer 215 may be, for example, $P^-$ polysilicon layer. Two or more memory cells in the same active strip (e.g., memory cells 221, 222 and 223 of FIG. 4C) share a common drain electrode. Likewise, two or more memory cells in the same active strip (e.g., memory cells 221, 222 and 223 of FIG. 4C) share a common source electrode. The memory cells along the same active strip form one or more NOR strings.

Charge-trapping layer 210 can accumulate positive electric charge that enables conduction ("channel formation") between conductive semiconductor layers 218 and 219 (both $N^+$-type polysilicon) at the surface of shallow $P^-$ polysilicon substrate layer 215. Accumulation of negative charge in charge-trapping layer 210, however, prevents channel formation, thereby keeping conductive semiconductor layers 218 and 219 decoupled.

FIG. 5 shows schematic circuit for memory cells in two NOR strings 501 and 502 in two active strips sharing sense amplifier 255, according to one embodiment of the present invention. As shown in FIG. 5, bit line or common drain electrode 217 (representing metal layer 217 and $N^+$ polysilicon layer 218 in FIG. 4B) of NOR string 501 are connected to sense amplifier 255 by a NMOS selection transistor 230. Common drain electrode 220 of NOR string 502 is isolated from sense amplifier 255 by NMOS selection transistor 231, which is shown in FIG. 5 to have its gate electrode grounded (i.e., non-selected). Memory cells, e.g., memory cells 210, 211, 212, 213 and 214, are connected in parallel between common drain electrode 217 and common source electrode 219 in a NOR configuration to form NOR string 501. Each memory cell in a NOR string may be individually selected and activated by its associated word line. For example, in NOR string 501, word line 204 selects and activates memory cell 210. To determine the conductive state of memory cell 210, all other word lines along NOR string 501 are grounded, to prevent conduction in those un-selected memory cells. In FIG. 5, word line 223 is provided to activate its associated memory cells (e.g., memory cell 224) to equalize the voltage between the common drain electrode and the common source electrode in each of NOR strings 501 and 502 shown. The memory cells associated with word line 223 (the "pre-charge cells") are typically in the "erased" conductive state and are activated temporarily during a "pre-charge phase," during which the voltages on the drain and source electrodes of each associated NOR string are intentionally equalized.

FIG. 6 shows NOR string 501 with parasitic capacitors expressly shown, according to one embodiment of the present invention. As shown in FIG. 6, parasitic capacitor 250 represents the parasitic capacitance that exists between drain electrode 217 and source electrode 219. Also shown in FIG. 6 are (a) parasitic capacitors 241-248, representing the parasitic capacitances that exist between drain electrode 217 and the word lines (e.g., word line 204) associated with NOR string 501, and (b) parasitic capacitors 261-268, representing the parasitic capacitances that exist between source electrode 219 and the word lines (e.g., word line 204) associated with NOR string 501. In FIG. 6, parasitic capacitor 240 represents the sum of all the parasitic capacitances (e.g., parasitic capacitors 241-248) between the word lines and drain electrode 217, when the word lines are grounded. Similarly, parasitic capacitor 260 represents the sum of all the parasitic capacitances (e.g., parasitic capacitors 261-268) between the word lines and source electrode 219, when the word lines are grounded. Parasitic capacitor 225 represents the parasitic capacitance between the input electrode of sense amplifier 255 and ground.

The memory cells along NOR string 501 store and erase information by capturing or removing electric charge in or from an electrically isolated charge-trapping layer. The electric charge is injected into or removed from the charge-trapping layer through tunneling (e.g., Fowler-Nordheim tunneling) or another suitable process. The electric charge may persist in the charge-trapping layer for extensive periods of time, even during periods when no power is supplied to the NOR string. Sense amplifier 255 determines the conductive state of a memory cell in an associated NOR string without noticeably changing the amount of charge captured in the charge-trapping layer, as the determination is made indirectly by sensing the conductive state of memory cell under a controlled condition.

The memory cells in a NOR string of the present invention (e,g., NOR string 501) differ significantly from conventional non-volatile NOR-type memory cells in that their common source electrode cannot be directly accessed from a circuit outside of the NOR string. Thus, the conventional current-sensing or voltage-sensing methods for determining the conductive state of the memory cell are not applicable. For example, in conventional "current-sensing," the current in a conducting memory cell is required to be relatively constant, which is achieved conventionally by keeping the voltage at the drain electrode substantially constant and the source electrode grounded. In a NOR string of the present invention, a constant memory cell current cannot be fulfilled as the voltage of the source electrode and the memory cell current change continuously when the memory cell enables charge sharing through conduction. Similarly, "voltage-sensing" methods do not work on a NOR string of the present invention, as a conducting memory cell cannot pull the voltage on the drain electrode of the memory cell to ground.

Figure 7A:
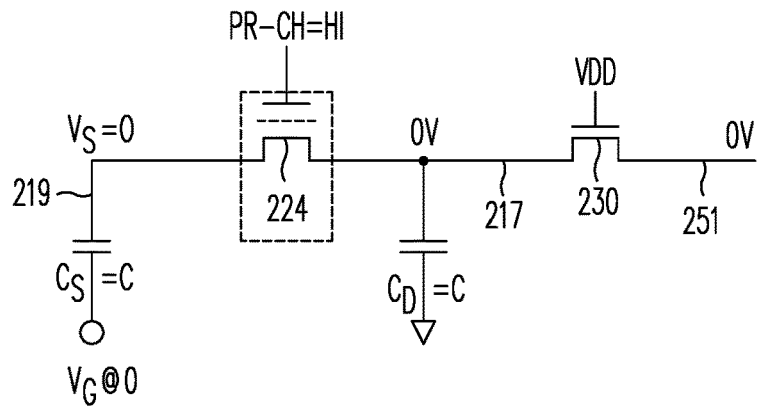
FIG. 7A shows pre-charge cell 224 preparing a condition for determining the conductive state of a memory cell in NOR string 501, which is directly connected to sense amplifier 255 by activated NMOS selection transistor 230.

FIG. 7A shows pre-charge cell 224 preparing a condition for reading (i.e., determining the conductive state) of a memory cell in NOR string 501, which is directly connected to sense amplifier 255 by activated NMOS selection transistor 230. In this configuration, drain electrode 217—which is accessible by an external circuit—is initialized to ground, and all the word lines associated with memory string 501 are also grounded. Thereafter, pre-charge cell 224 is activated to connect source electrode 219 to drain electrode 217, which also discharges the input electrode of sense amplifier 255 to ground through NMOS selection transistor 230. The gate electrode of pre-charge cell 224 is later set to an OFF state (i.e., 0 volts), thereby decoupling source electrode 219 from drain electrode 217. The input electrode of sense amplifier 255 and drain electrode 217 are then brought to supply voltage VDD by providing the gate electrode of NMOS selection transistor 230 a voltage that is at least (VDD+$V_T$), where $V_T$ is the threshold voltage of NMOS selection transistor 230. At this point, any memory cell in NOR string 501 (e.g., memory cell 210) may be selected for reading.

Figure 7B:
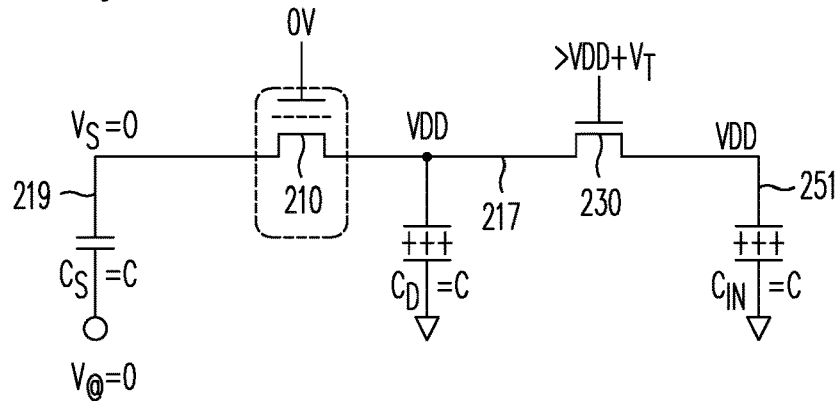
FIGS. 7B and 7C illustrate reading a "programmed" (i.e., non-conducting) memory cell and an "erased" (i.e., conducting) memory cell, respectively, according to one embodiment of the present invention.
Figure 7C:
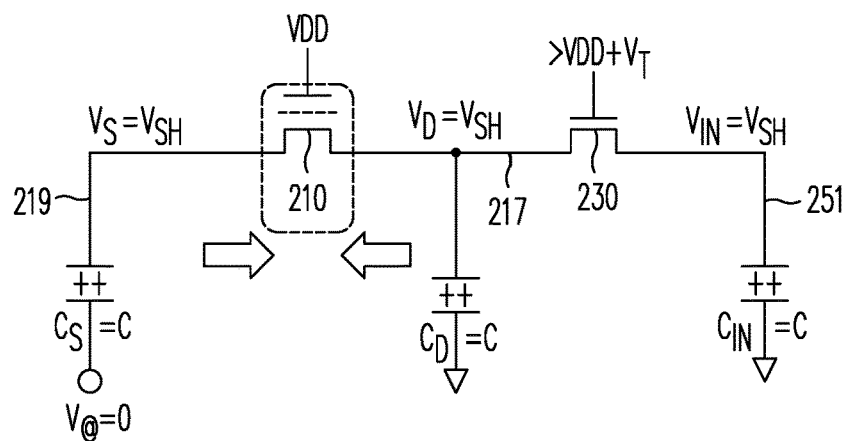

FIGS. 7B and 7C illustrate the reading of a "programmed" (i.e., non-conducting) memory cell and an "erased" (i.e., conducting) memory cell, respectively, according to one embodiment of the present invention. As shown in FIG. 7B, when a read voltage is applied on the word line of the memory cell to be read (i.e., memory cell 210), no charge-sharing occurs between drain electrode 217 and source electrode 219, as memory cell 210 is non-conducting or "programmed" Alternatively, as shown in FIG. 7C, if memory cell 210 is "erased," memory cell 210 is conducting, thus enabling charge sharing among the source and drain electrodes of memory cell 210 and the input electrode of sense amplifier 255. If the capacitance to ground of the drain and source electrodes of memory cell 210 and the input electrode of sense amplifier 255 are equal, for example, the final voltage resulting from charge-sharing is $V_{SH}$=⅔ VDD. In a suitably designed sense amplifier, ideally, the voltage swing at its input electrode would be ⅓ VDD (as in this case), which is sufficient to reliably provide a change the sense amplifier's output state.

Figure 7D:
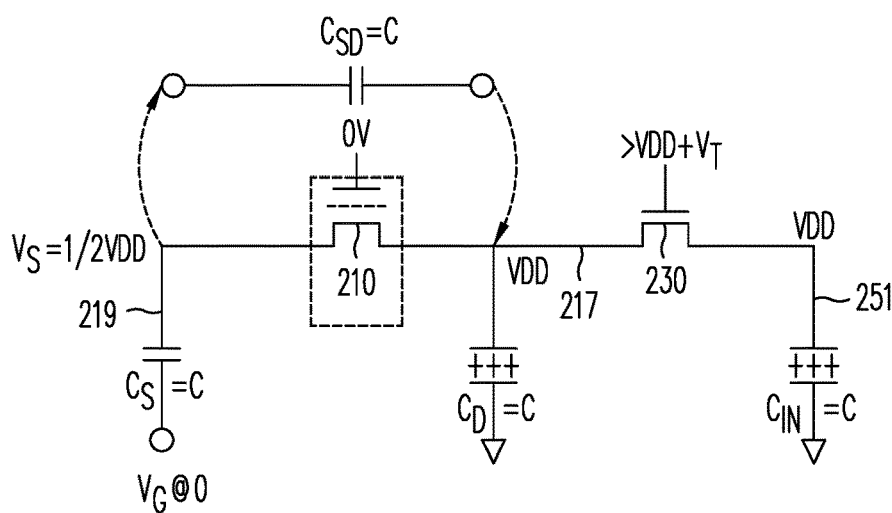
FIG. 7D illustrates reading memory cell 210 of FIGS. 7B and 7C, taking into consideration the parasitic capacitance between drain electrode 217 and source electrode 219, in accordance with one embodiment of the present invention.

The examples of FIGS. 7B and 7C do not account for the parasitic capacitance between source electrode 219 and drain electrode 217. FIG. 7D illustrates reading memory cell 210 of FIGS. 7B and 7C, taking into consideration the parasitic capacitance between drain electrode 217 and source electrode 219, in accordance with one embodiment of the present invention. If the parasitic capacitance C between source electrode 219 and drain electrode 217 is equal to each of the parasitic capacitance at the other nodes, when drain electrode 217 is brought to voltage VDD by activation of NMOS selection transistor 230, floating source electrode 219 may couple up to voltage ½VDD. In that case, charge-sharing during the read operation results in an equalized voltage $V_{SH}$=⅚VDD, reducing the voltage swing at the input electrode of sense amplifier 255 to ⅙VDD, as compared to ⅓ VDD in the case illustrated in FIG. 7C. If the parasitic capacitance at input electrode 251 of sense amplifier 255 is negligibly small, relative to the parasitic capacitances at drain electrode 217 and source electrode 219, the voltage swing at input electrode 251 of sense amplifier 255 improves to ¼VDD. Between these two cases, the "direct connection" approach may not provide sufficient margin. Also, biasing the gate electrode of NMOS selection transistor 230 above VDD requires internal charge-pumping, which increases power dissipation and slows the access signals.

To move the voltage at input electrode 251 of sense amplifier 255 across a discrimination level in the charge-sharing exchange, common source electrode 219 of NOR string 501 must provide an enough pull-down weight (i.e., a parasitic capacitance at least comparable to the combined capacitances of drain electrode 217 and input electrode 251 of sense amplifier 255). Assuming equal capacitances in source electrode 219 and drain electrode 217 (and, to simplify, neglecting the parasitic capacitance at input electrode 251 of sense amplifier 255), the voltage separation between source electrode 219 and drain electrode 217 should be at least twice the trip-point voltage swing.

Figure 8A:
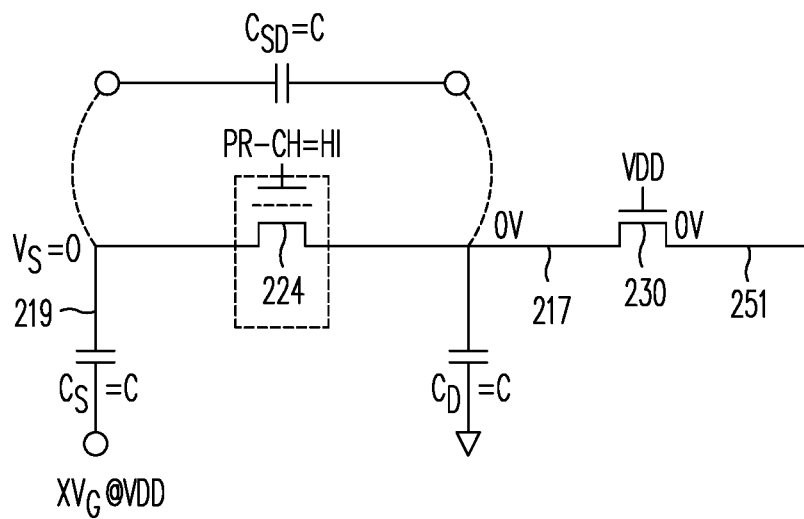
FIG. 8A shows pre-charge cell 224 preparing a condition for determining the conductive state of a memory cell in NOR string 501, with source electrode 219 coupled to word lines that are set to supply voltage VDD, in accordance with one embodiment of the present invention.

One way to provide sufficient voltage separation between source electrode 219 and drain electrode 217, after source electrode 219 is coupled to an elevated voltage as a result of drain electrode 217 connecting to input electrode 251 of sense amplifier 255, is to use word lines to couple the voltage at source electrode 219 back down. FIG. 8A shows pre-charge cell 224 preparing a condition for determining the conductive state of a memory cell in NOR string 501, with source electrode 219 coupled to a predetermined number of word lines that are set to supply voltage VDD, in accordance with one embodiment of the present invention. As in FIG. 7A, in the configuration of FIG. 8A, drain electrode 217 is initialized to ground. However, unlike the configuration of FIG. 7A, a predetermined number of word lines coupled to source electrode 219 are set to supply voltage VDD. Pre-charge cell 224 is then activated to equalize the voltages at source electrode 219 and drain electrode 217, thereby also discharging input electrode 251 of sense amplifier 255 to ground through NMOS selection transistor 230. The gate electrode of pre-charge cell 224 is then set to a LOW logic state (e.g., 0 volts) to decouple source electrode 219 from drain electrode 217.

Figure 8B:
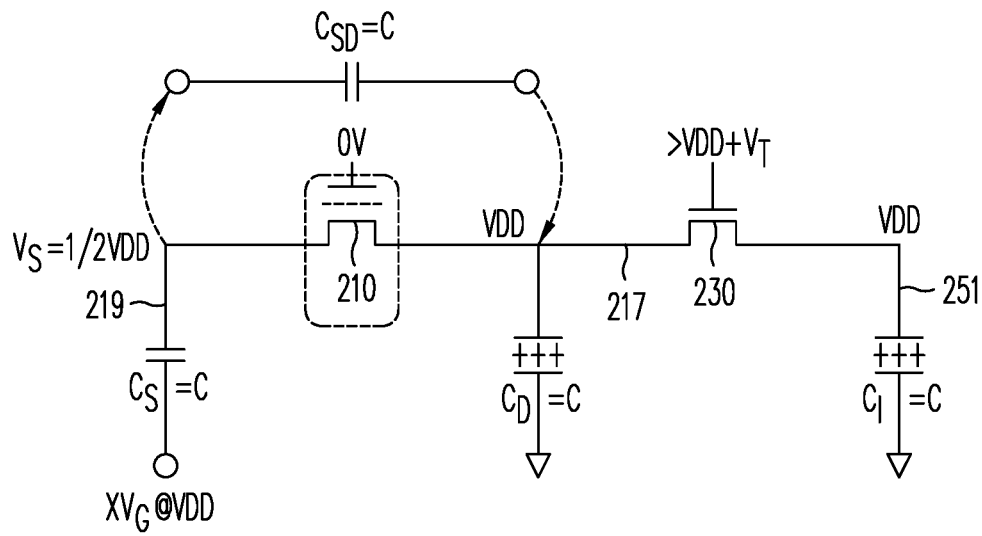
FIGS. 8B and 8C illustrate reading a "programmed" (i.e., non-conducting) memory cell 210 using a technique that changes coupled word line voltages, according to one embodiment of the present invention.
Figure 8C:
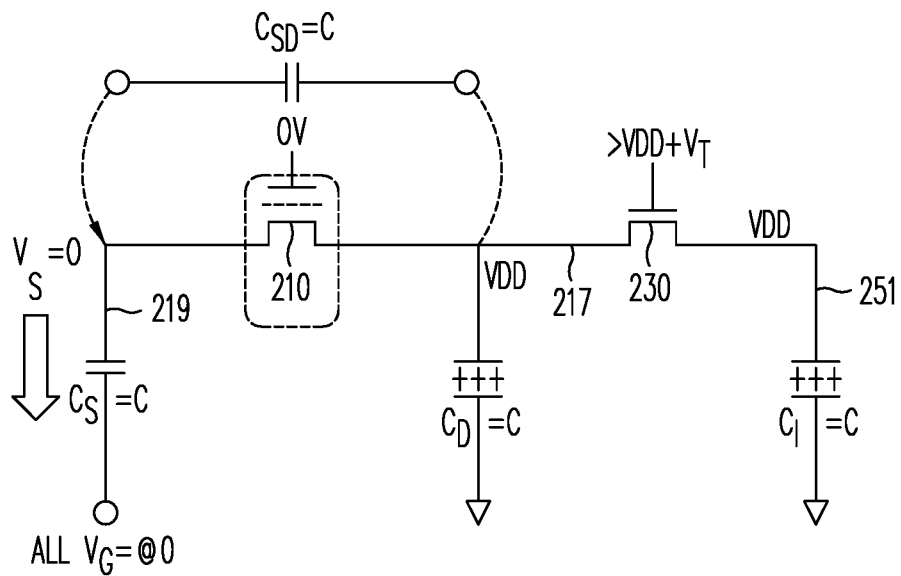

FIGS. 8B and 8C illustrate reading "programmed" (i.e., non-conducting) memory cell 210 using a technique that uses a change in coupled word line voltages, according to one embodiment of the present invention. As shown in FIG. 8B, after source electrode 219 is decoupled from drain electrode 217 (as described above in conjunction with FIG. 8A), the voltage at the gate electrode of NMOS selection transistor 230 is increased to greater than supply voltage VDD plus its threshold voltage of $V_T$, which results in both drain electrode 217 and input electrode 251 of sense amplifier 255 being brought up to supply voltage VDD. Because of the parasitic capacitance between drain electrode 217 and source electrode 219, source electrode 219 may be brought up simultaneously to voltage ½VDD, as explained above in conjunction with FIG. 7D. Thereafter, the word lines coupled to source electrode 219 that are set to supply voltage VDD are brought to ground, such as illustrated in FIG. 8C. Grounding these words lines couples source electrode 219 back to ground (i.e., 0V), or even lower, when a large enough number of word lines participate in this step-down technique.

Figure 9:
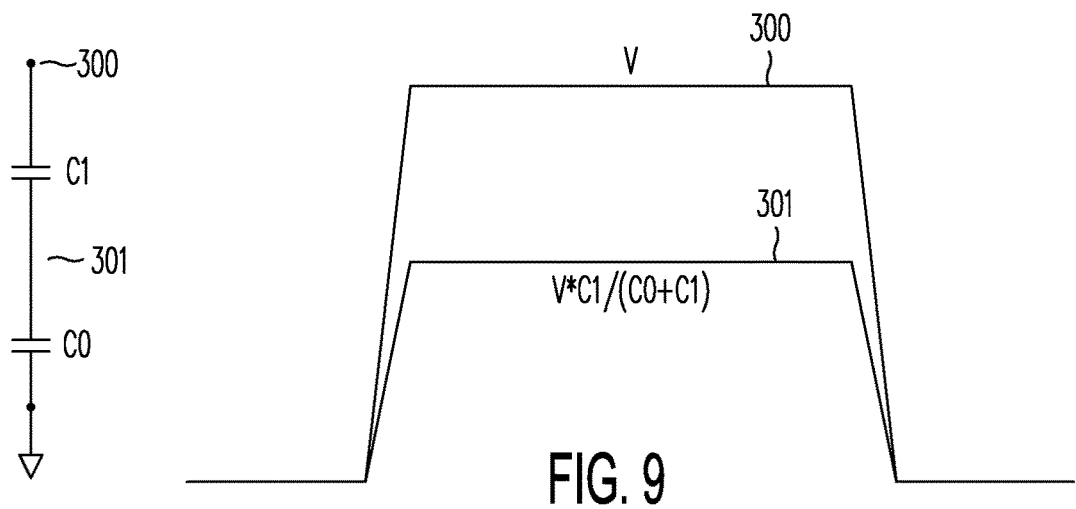
FIG. 9 shows capacitors C0 and C1 coupling floating node 301 to an input electrode (node 300) and to ground, respectively.

The present invention provides an approach for accurately coupling voltages to floating nodes using substantially uniform capacitive coupling to semiconductor layers and by crafting word line signals of various shapes and amplitudes. FIG. 9 illustrates by example capacitors C0 and C1 coupling floating node 301 to an input electrode (i.e., node 300) and to ground, respectively. Floating node 301 may represent, for example, a floating semiconductor layer serving as a common source electrode (e.g., source electrode 219 of FIG. 8B). Capacitor C1 may represent the coupling of node 301 to a certain number of grounded word lines, while input electrode 300 may represent the rest of the word lines receiving a crafted waveform. As shown in FIG. 9, a pulse received at node 300 induces at node 301 a change in voltage that is a fraction CR ("coupling ratio") of the amplitude of the pulse received at node 300; specifically, coupling ratio CR is given by CR=C1/(C0+C1).

Figure 10A:
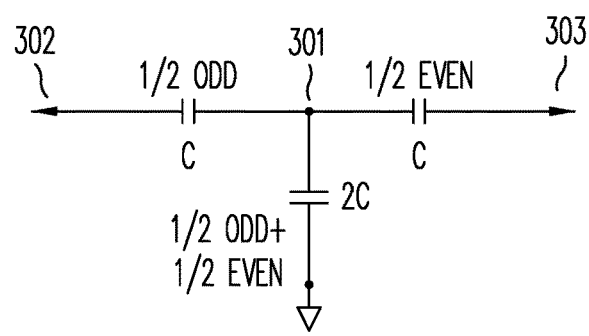
FIG. 10A is a further refinement of the model of FIG. 9.

FIG. 10A is a further refinement of the model of FIG. 9. Consider the case where the voltages at half of all ODD word lines are represented by the voltage at node 302. This voltage is coupled to node 301 (e.g., source electrode 219 in FIG. 8A) by the parasitic capacitance C. The other half of all ODD word lines—which are set to ground—are also coupled by the same parasitic capacitance C to node 301, to a relatively high accuracy. Similarly, the voltage at half of all EVEN word lines, represented by node 303, is coupled by parasitic capacitance C to node 301 also, and the voltage in the rest of EVEN word lines are set to ground. The parasitic capacitance of the grounded ODD and EVEN word lines bring the total parasitic capacitance coupling node 301 to ground to 2C. Each of the nodes 302 and 303, by themselves, has a coupling ratio of ¼ to floating node 301. Therefore, in FIG. 10B, a step-up signal of VDD amplitude at node 302 results in a corresponding ¼ VDD amplitude step-up in floating node 301 over its initial value. Initially, node 303 is stable at VDD (thus serves as an "AC ground"). A step-down at node 303 from VDD to ground is coupled into floating node 301 as a ¼ VDD amplitude step-down, bringing floating node 301 back to its initial value before the voltage step-up induced by node 302. The amplitude and shape of a coupled signal can be controlled by setting an appropriate number of word lines to a predetermined input signal and an appropriate number word lines to a DC or AC ground.

Figure 10B:
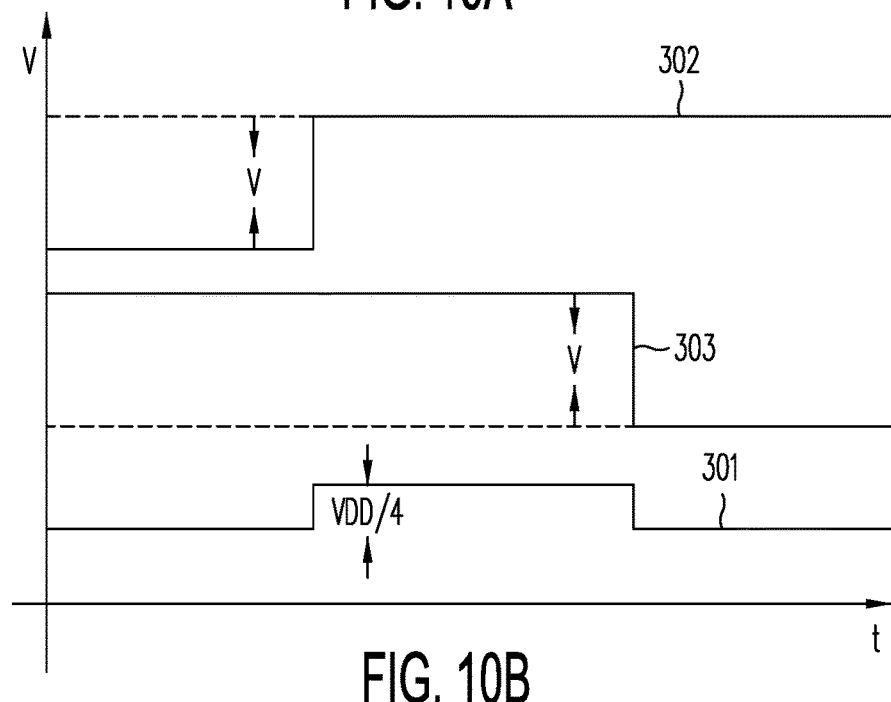
FIG. 10B shows exemplary waveforms at nodes 301, 302 and 303 of the model of FIG. 10A.
Figure 11A:
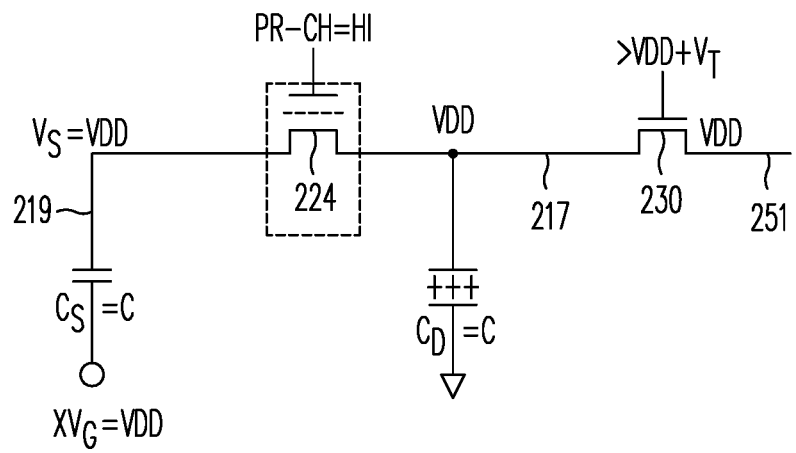
FIGS. 11A, 11B and 11C illustrate another method for direct-connection data sensing using the principle of operation in the model of FIGS. 10A-10B.
Figure 11B:
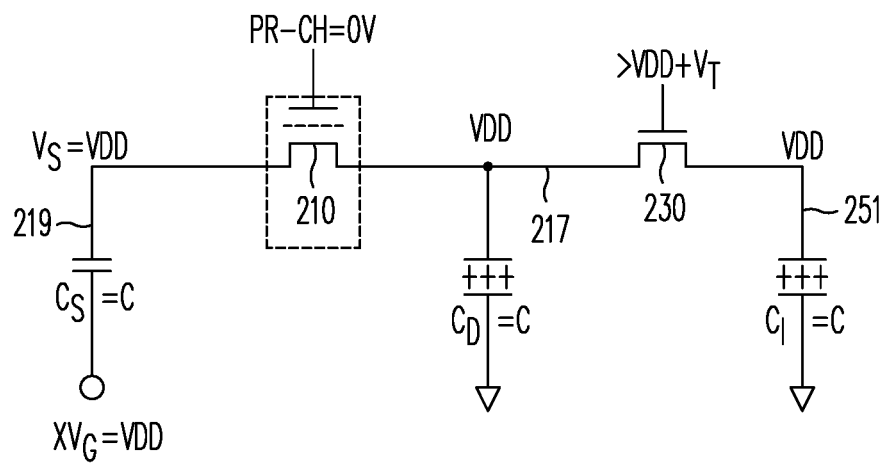
Figure 11C:
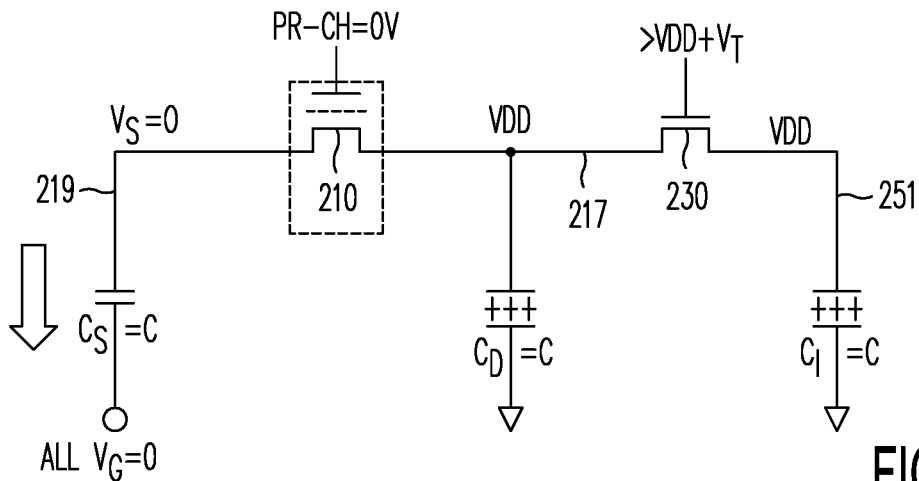

The principle illustrated by FIGS. 10A and 10B provides another method of direct-connection data sensing. Initially, referring to FIG. 11A, drain electrode 217 and source electrode 219 are initialized HIGH (i.e., at supply voltage VDD) by turning on pre-charge transistor 224 after setting a predetermined number of local word lines to supply voltage VDD. (String selection transistor 230—which has its gate electrode set to a voltage that is greater than the sum of its threshold voltage and supply voltage VDD—sets drain electrode 217 to supply voltage VDD.) Then, pre-charge transistor 224 is turned off, isolating drain electrode 217 from source electrode 219 (FIG. 11B). (This sequence for preparing data sensing is different from that illustrated by FIGS. 8A, 8B and 8C, in which drain electrode 217 and source electrode 219 are initialized to 0V.) Next, as shown in FIG. 11C, source electrode 219 is coupled down to a convenient voltage by stepping down the word lines that are previously at supply voltage VDD to ground. This method provides an alternative to the LOW initialization set-up procedure described above in conjunction with FIGS. 8A-8C.

Figure 12A:
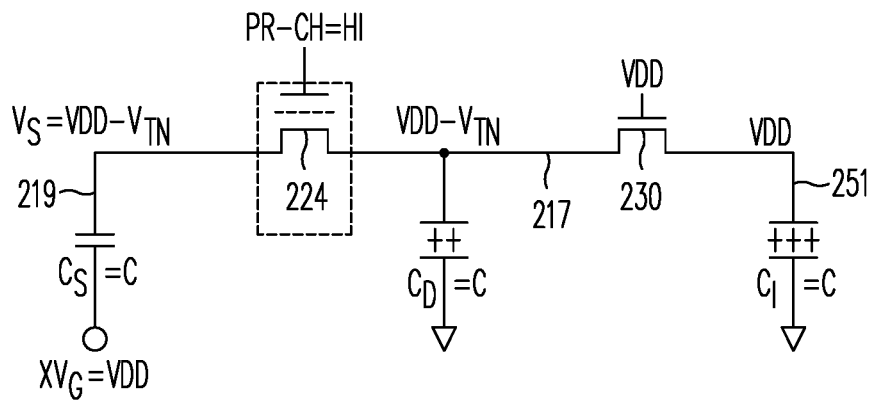
FIGS. 12A, 12B, 12C, 12D and 12E illustrate data sensing of storage transistor 210 using a "diode-like" connection between drain electrode 217 and sense amplifier input electrode 251.
Figure 12B:
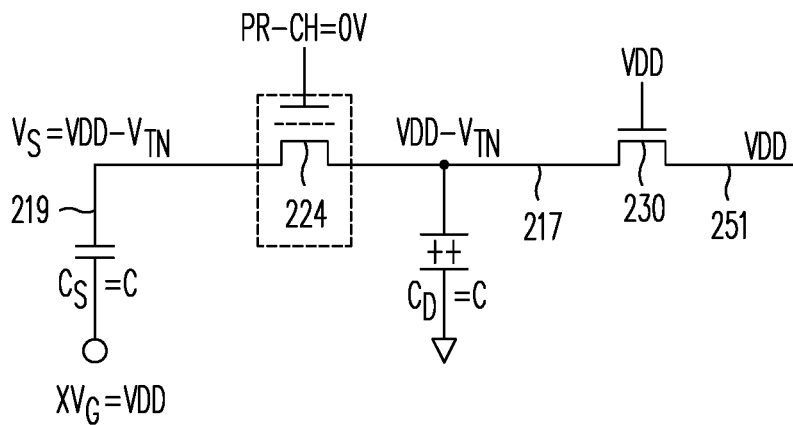
Figure 12C:
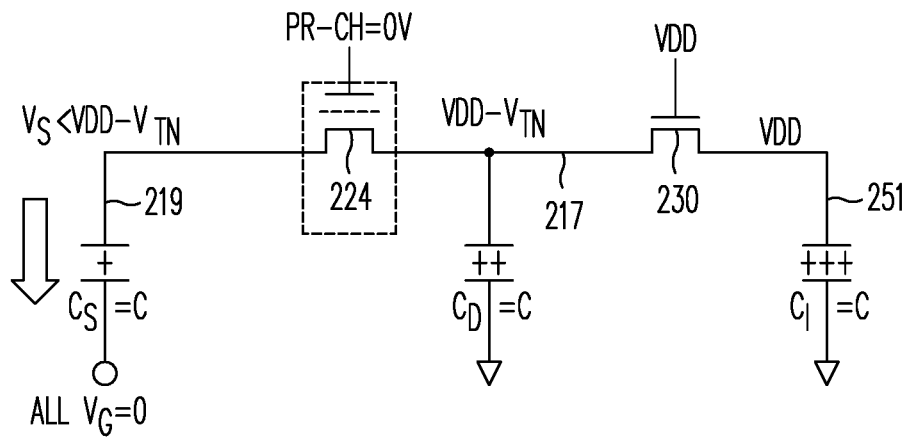
Figure 12D:
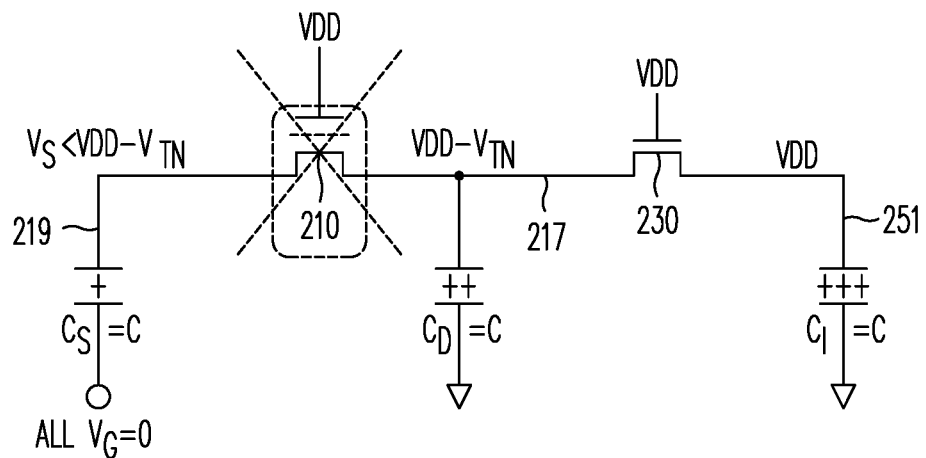
Figure 12E:
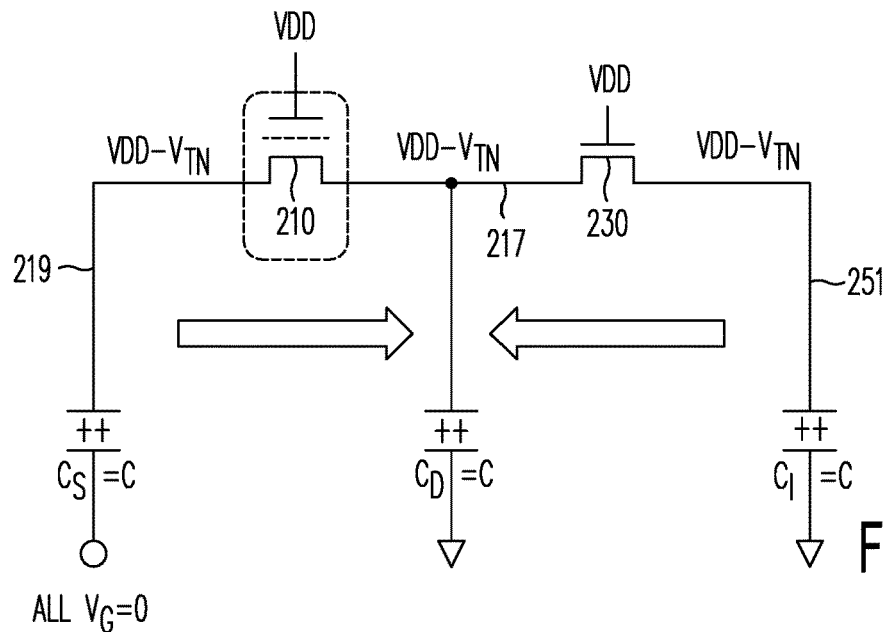

Alternatively, drain electrode 217 and sense amplifier input electrode 251 of sense amplifier 255 may be connected through a "diode-like" connection, such as illustrated in FIG. 12A, with a predetermined number of word lines at high bias (i.e., supply voltage VDD). As shown in FIG. 12A, with pre-charge transistor 224 in the conducting state, the voltage at the gate electrode of string selection transistor 230 is set to supply voltage VDD, so that both source electrode 219 and drain electrode 217, and their parasitic capacitance, are brought to voltage $VDD-V_{TN}$ (i.e., supply VDD less the threshold voltage of string selection transistor 230). Under this method, unlike the method of FIGS. 11A-11C discussed above, the gate electrode of string selection transistor 230 does not require a voltage greater than supply voltage VDD, thereby simplifying voltage generation and management issues. Under this method, drain electrode 217 and source electrode 219 are initialized to voltage $VDD-V_{TN}$, which is below the judgement breakpoint of sense amplifier 255, $VDD-V_{TP}$. In this example, although the voltage at the gate terminal of string selection transistor 230 is at supply voltage VDD, lower voltages than supply voltage VDD may also be used at the gate terminal of string selection transistor 230, to achieve a pre-charge voltage at source electrode 219 and drain electrode 217 between supply voltage VDD and ground. In this highly unidirectional type of connection, voltages between VDD and ground can be practically maintained for very long periods of time on the drain electrode 217. Next, source electrode 219 is decoupled by turning off pre-charge transistor 224 (FIG. 12B). As mentioned above, a high-biased source electrode 219 can be coupled down by stepping down some or all of the coupled word lines from voltage VDD to ground. Depending upon the number of word lines participating in this operation, one can set any desired source electrode voltage $V_S$, as suggested in FIG. 12C. If memory cell 210 is in the programmed state (i.e., non-conducting), a read voltage (e.g., supply voltage VDD) imposed at its gate electrode would not result in a change in the voltages at drain electrode 217 and source electrode 219, so that input electrode 251 of the sense amplifier remains at voltage VDD (FIG. 12D). In this case, no change in logic state occurs at sense amplifier 255's output electrode. The output value of sense amplifier 255 may be designed to be LOW (i.e., at ground) in this case. However, if memory cell 210 is in the erased state (i.e., conducting), when its gate electrode is set to the read voltage, charge-sharing occurs among source electrode 219, drain electrode 217 and input electrode 251 of sense amplifier 255 (FIG. 12E), so that a voltage swing results at input electrode 251 of sense amplifier 255. Under certain conditions—to be described later—the final voltage resulting from the charge-sharing can be $VDD-V_{TN}$ or lower. As pointed out earlier, the $VDD-V_{TN}$ voltage level is below the sense amplifier trip point $VDD-V_{TP}$, thus the output electrode of sense amplifier 255 trips to logic HI (i.e., supply voltage VDD).

Figure 13A:
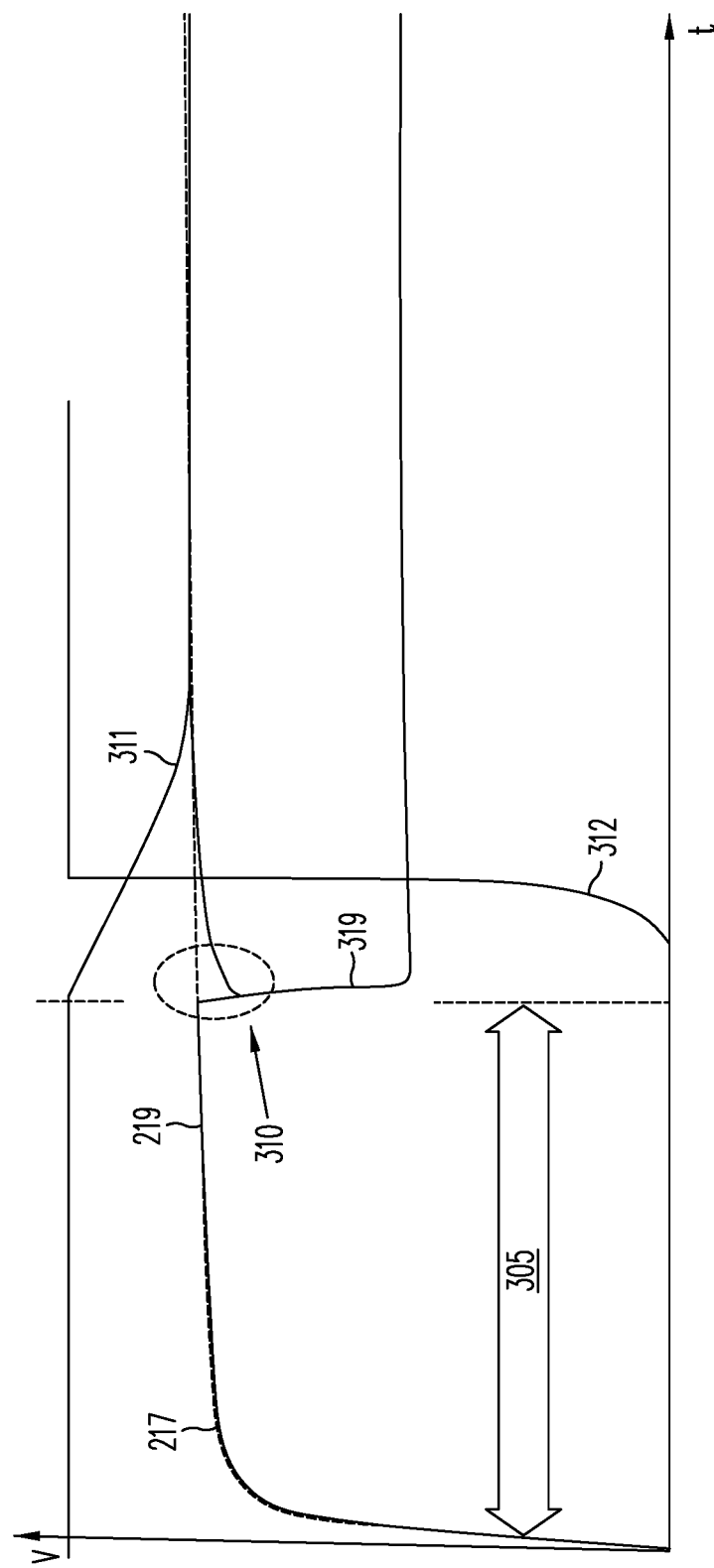
FIGS. 13A, 13B and 13C illustrate the operations on a non-conducting (i.e., programmed) memory cell under the method of FIGS. 12A, 12B, 12C, 12D and 12E.
Figure 13B:
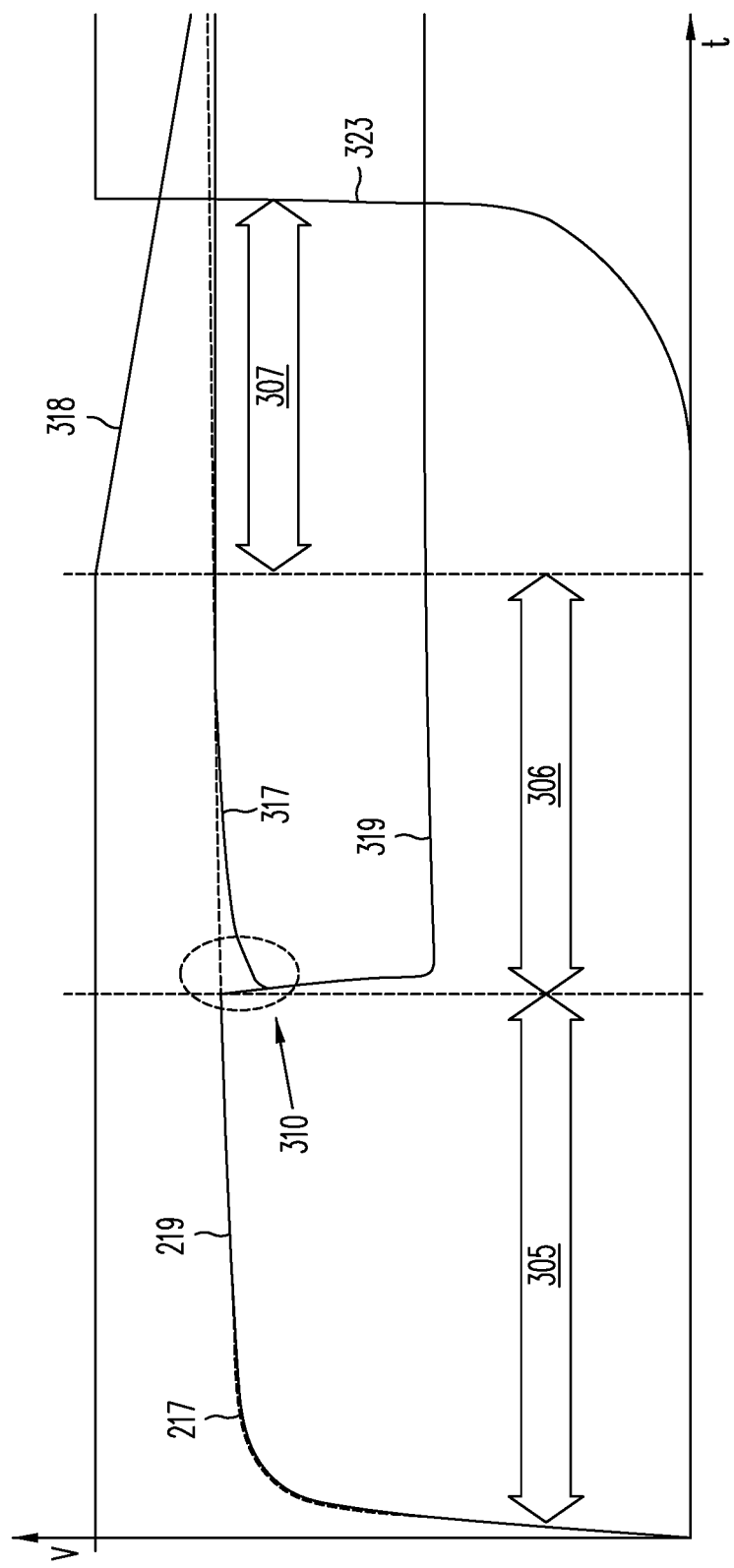
Figure 13C:
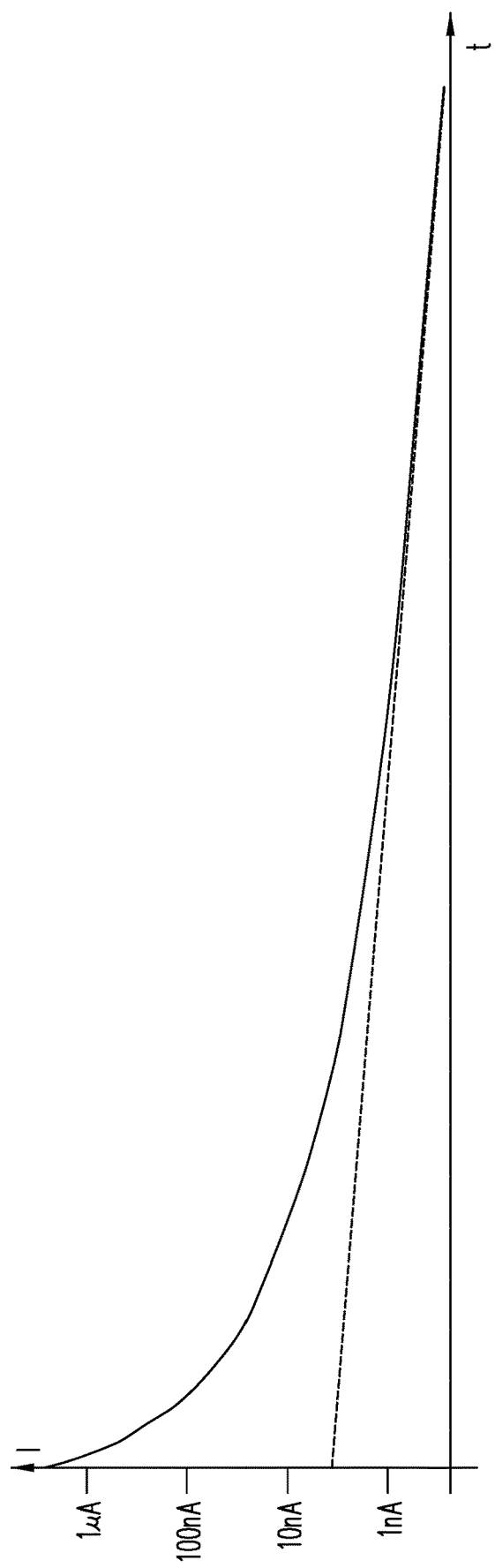

The sensing operations for a non-conducting (i.e., programmed) memory cell under the method of FIGS. 12A-12E is further discussed with respect to the signal waveforms of FIGS. 13A-13C. As shown in FIG. 13A, in the diode-like connection, the initial equalization step (FIG. 12A-12C) is performed over time interval 305, during which both drain electrode 217 and source electrode 219 are brought as close as possible to voltage $VDD-V_{TN}$. Then, source electrode 219 is decoupled from drain electrode 217 when pre-charge transistor 224 is turned OFF, while drain electrode 217 remains connected to input electrode 251 of sense amplifier 255. Source electrode 219—which is now floating—is then coupled down by bringing to ground voltage a certain number of coupled word lines that are kept at a high voltage at the initialization step. As shown in FIG. 13A, the voltage waveform at source electrode 219 shows this step-down step by waveform segment 319. Although drain electrode 217 is also coupled down by the voltage step-down at the word lines, glitch 310 illustrates that drain electrode 217's connection to input electrode 251 of sense amplifier 255 reduces the disturbance. However, if input electrode 251 of sense amplifier 255 is released for data evaluation at the time of glitch 310, the effects of glitch 310 and the leakage current at input terminal 251 of sense amplifier 255, illustrated by waveform segment 311, may trigger a spurious change in output state of the sense amplifier (waveform segment 312), even though the memory cell being read is non-conducting (i.e., no charge-sharing during the read operation).

To avoid the erroneous output logic state change at sense amplifier 255, a recovery time is necessary to allow drain electrode 217 after glitch 310 to return to voltage $VDD-V_{TN}$. This recovery time is illustrated in FIG. 13B. As shown in FIG. 13B, at the end of recovery time interval 306, if input electrode 251 of sense amplifier 255 is released to enable memory cell sensing, the leakage current at input electrode 251 of sense amplifier 255 (waveform segment 318) triggers a flip in output state in sense amplifier 255 only after time interval 307 (in the case of a non-conducting or programmed memory cell being read). In this case, the trigger for the spurious change in output state of the sense amplifier is the charging-up current at drain electrode 217. (Note that, the output state change is still a false signal.) FIG. 13C further illustrates the importance of the sensing delay by showing in logarithmic scale the diminishing current of a capacitor charging-up to VDD-$V_{TH}$. As shown in FIG. 13C, the charging current decreases asymptotically to appear linear after some time. As the charging current in FIG. 13C is presented in logarithmic scale, this almost linear decrease means that the voltage at drain electrode 217 increases asymptotically towards voltage VDD-$V_{TH}$, with constant voltage gain at equal intervals. When the recovery time is insufficient, the output state of the sense amplifier trips too early (FIG. 13A). The longer the recovery time and the smaller the charge-up current, the further the false output state change is pushed out in time. In other words, a spurious signal happens sooner or later: sooner due to glitch 310 (FIG. 13A), and later, if a sufficient recovery time is allowed (FIG. 13B).

FIGS. 13A and 13B show that a recovery interval can reduce the chance of a false signal triggered by glitch 310 of drain electrode 217 coupling down, but data sensing may still be vulnerable to a high cumulative sub-threshold leakage current in the unselected memory cells. Because the leakage current begins instantly after source electrode 219 is decoupled and data detection begins, a false output state change due to the leakage current argues against a long recovery interval. Thus, the recovery interval may not prevent the false trigger in the presence of high memory cell leakage current.

FIGS. 14-19 below show improvements that overcome the deficiencies of the method of FIGS. 12A-12E, as illustrated by FIGS. 13A and 13B. Up to a point, circuits selecting and driving the bit lines in a memory string need not scale up with longer memory strings, thus providing a longer memory string a chip-area advantage. However, a longer memory string requires a longer time in the charging and discharging of the common source and drain electrodes, as well as a greater sub-threshold leakage current, simply because of the number of memory cells present. In the examples of FIGS. 13A and 13B, the higher the memory cell leakage current, the sooner the false sensing signal appears. To mitigate this effect, the source electrode, which is a conductive layer, may be divided into segments. FIG. 14 shows the source layer (i.e., source electrode 219 of FIG. 12A, for example) divided into source segments 402, 403, 404, and 405. Segmenting a common source layer into segment is disclosed in U.S. provisional patent application, Ser. No. 62/522,665, entitled "3-Dimensional NOR Strings with Segmented Shared Source Regions," filed Jun. 20, 2017.

Figure 15A:
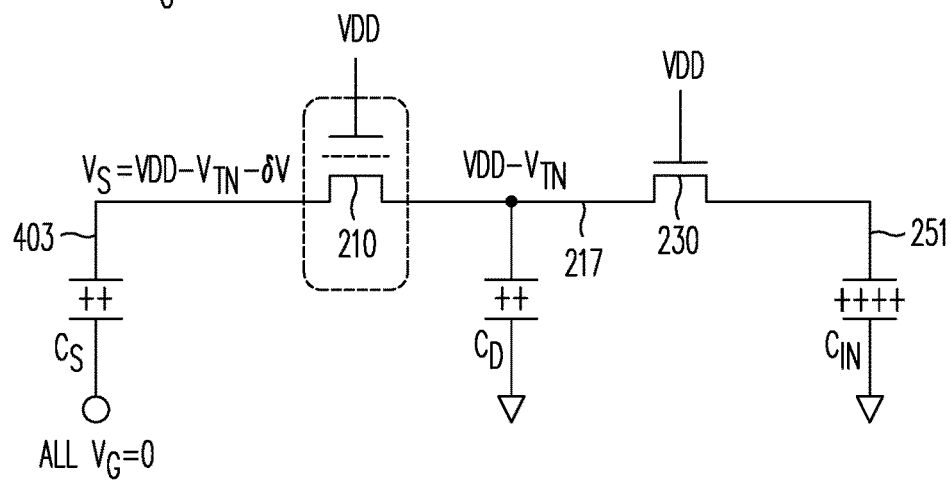
FIGS. 15A and 15B illustrate a method for determining a suitable segment size based on the diode-like connection illustrated in FIGS. 12A-12E above.
Figure 15B:
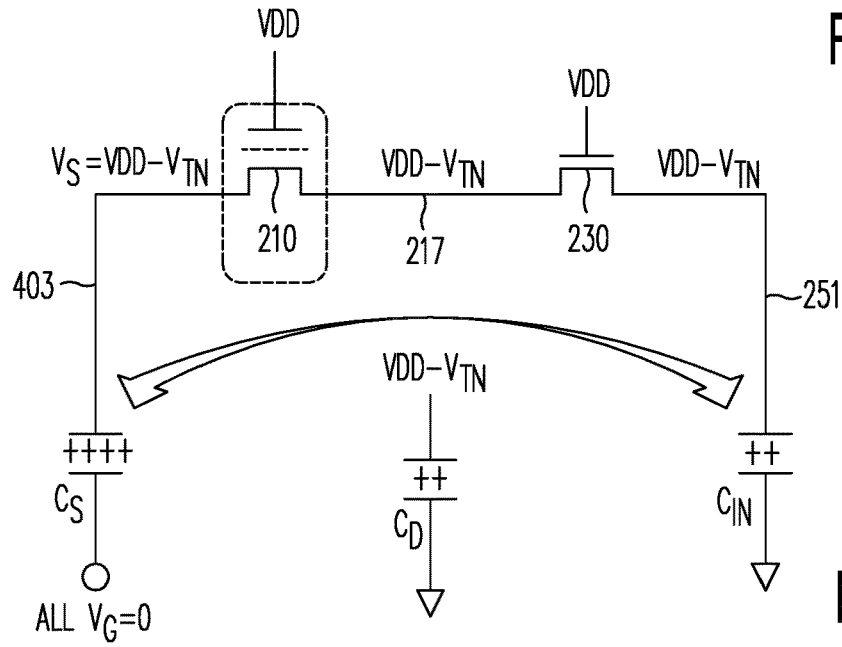

Although source segmentation reduces leakage currents, it also diminishes the pull-down strength of the source electrode. Thus, a suitable segment size depends on the ratio of the segment's total capacitance to the input capacitance of input terminal 251 of sense amplifier 255. FIGS. 15A and 15B illustrate a method for determining a suitable segment size based on the diode-connection approach illustrated in FIGS. 12A-12E above. As shown in FIG. 15A, after stepping down all the coupled word lines, source segment 403 is floating at voltage $V_S$=VDD-$V_{THN}$-$\delta V$, while drain electrode 217 is charged-up to VDD-$V_{TN}$ by string selection transistor 230, whose gate electrode is set to supply voltage VDD. (Capacitive input electrode 251 of sense amplifier 255 is initialized to supply voltage VDD). Next, all nodes are floated by disconnecting input electrode 251 of the sense amplifier from supply voltage VDD. Charge is conserved regardless of whether memory cell 210 is programmed or erased. In the conducting state (i.e., erased), the voltages on source segment 403, drain electrode 217 and input terminal 251 of the sense amplifier converge towards a common value, which is determined by the ratio of the total charge to the sum of all three capacitances. This final value is independent of the sequence in which the nodes are connected.

One way to determine how much segmentation is allowable is next described. As no current flows between two nodes of the same potential, even if a conductive path exists between them, all three capacitors (i.e., parasitic capacitances of source electrode 219, drain electrode 217 and input terminal 251 of sense amplifier 255) may hold the same voltage "VDD-$V_{TN}$" in theory. FIG. 15B shows one such instance, when drain electrode 217 is charged to voltage VDD-$V_{TN}$, and source segment 403 and input electrode 251 of the sense amplifier separately reaching the same voltage VDD-$V_{TN}$ after charge sharing. In other words, for erased memory cell 204, the voltage at drain electrode 217 does not change when, by happenstance, the quantity of charge Q shared between input electrode 251 of sense amplifier 255 (i.e., parasitic capacitance $C_{IN}$) and source segment 403 (i.e., parasitic capacitance $C_S$) is Q=$\delta V^* C_S$=$V_{TN}^* C_{IN}$, where $\delta V$ is the voltage difference between drain electrode 217 and source segment 403 before charge sharing, and $V_{TN}$ is the voltage difference between drain electrode 217 and input electrode 251 of sense amplifier 255 before charge sharing.

Thus, if $\delta V$=$V_{TN}^* C_{IN}/C_S$, where $\delta V$ is the initial voltage separation between the drain and the source electrodes, drain electrode 217 does not change its voltage, regardless of whether memory cell 204 is programmed or erased, and input electrode 251 of sense amplifier 255 either: 1) remains unchanged, when the memory cell 204 is programmed (i.e., non-conducting), or 2) has a voltage swing of $V_{TN}$, when memory cell 204 is erased (i.e., conducting). To define a discriminating condition, the initial voltage separation W between drain electrode 217 and source segment 403 must satisfy the relation $\delta V$>$V_{TP}^* C_{IN}/C_S$ for the sense amplifier to develop an input voltage swing of at least $V_{TP}$—the sense amplifier trip point—when the memory cell is conducting. Although segmenting the source layer has benefits, like access time and leakage reduction, no further segmentation can occur after the relation $\delta V^* C_S$=$V_{TP}^* C_{IN}$ is met. The above relation shows that, for a given segment size, the voltage separation between drain electrode 217 and source segment 403 is related to the capacitance at the input electrode of the sense amplifier, but is independent of the length of the drain layer.

Figure 15C:
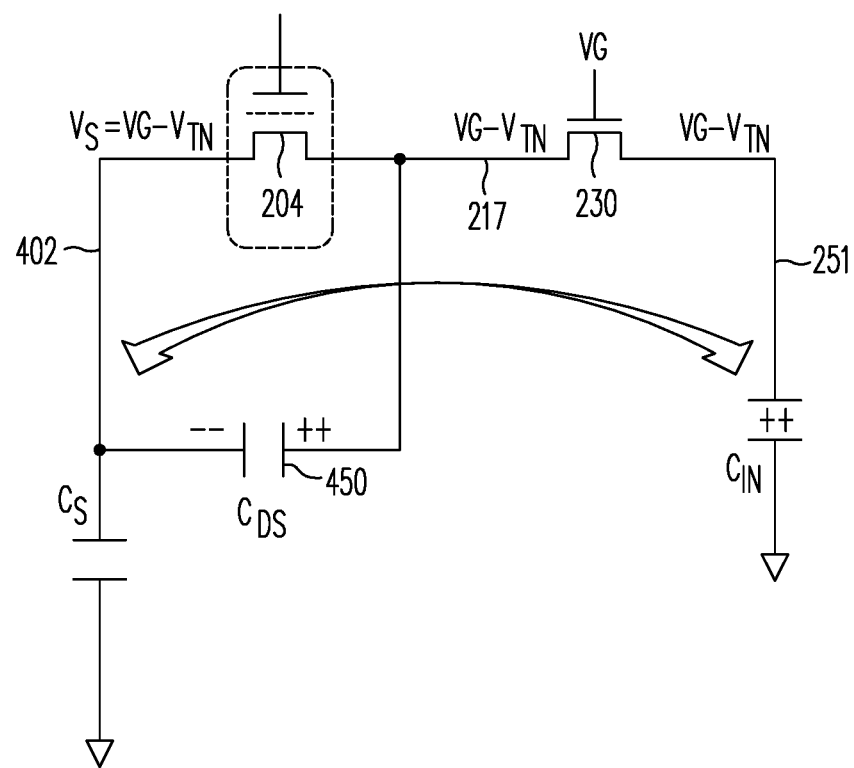
FIG. 15C shows the case where drain-to-source capacitance (i.e., capacitor 450) is taken into account, when drain-to-ground capacitance is ignored.

FIG. 15C shows the case where drain-to-source capacitance (i.e., $C_{DS}$, represented by capacitor 450) is taken into account, when drain-to-ground capacitance is ignored (i.e., the drain-to-ground capacitance is deemed negligible relative to either $C_{DS}$ or the source-to-ground capacitance ($C_S$)). Before a read voltage is placed on memory cell 204, voltage $V_{DS0}$ is maintained across source 402 and drain node 217. The voltage VG-$V_{TN}$ at drain 217 can be maintained for a very long period of time because of the "diode-like" connection provided by voltage VG at the gate of transistor 230, when memory cell 204 is non-conducting. When memory cell 204 is conducting, charge sharing between the capacitive nodes occurs, resulting in the voltage at input electrode 251 of sense amplifier 255 decreasing at the expense of the voltage at source electrode 403. Even with the voltage at drain electrode 217 being kept constant at VG-$V_{TN}$, a swing of at least $V_{TP}$ can be induced at input electrode 251 of sense amplifier 255 if $V_{DS0}*C_S > V_{TP}*C_{IN}$.

The inventor observes that combining a diode-like connection approach with a segmented source electrode speeds up sensing. As discussed in conjunction with FIG. 13C above, using word line coupling to change the voltage on a source segment by voltage δV, relative to a drain electrode that is charged-up to voltage VDD–$V_{TN}$, may induce an undesirable coupling at the drain electrode. Preventing such coupling, however, may avoid glitch 310 of FIG. 13A and hence avoid having to provide the required recovery time. A method for coupling down the source segment without affecting the voltage at the drain electrode is accordingly presented next.

In the memory structure discussed above, while the voltage at drain electrode 217 can be initialized by connection to an outside circuit, the voltage on a common floating source electrode 219 can be set only by equalizing with drain electrode 217 and subsequent capacitive coupling from local word lines, if desired. Drain electrode 217 and source electrode 219, whether provided as a continuous source layer or as a source segment, are coupled to a significant number of local word lines that may be used to induce voltage changes at both drain electrode 217 and source electrode 219. When reading memory cell 210, source electrode 219 must be activated or loaded through a voltage separation from drain electrode 217, as discussed above. If source electrode 219 is a source segment, all other source segments should remain inactive—i.e., there should not be a voltage separation between each source segment and drain electrode 217—to reduce current leakage. If word line signal coupling is used, drain electrode 217 may be disturbed, so that a drain recovery time is required.

Figure 16A:
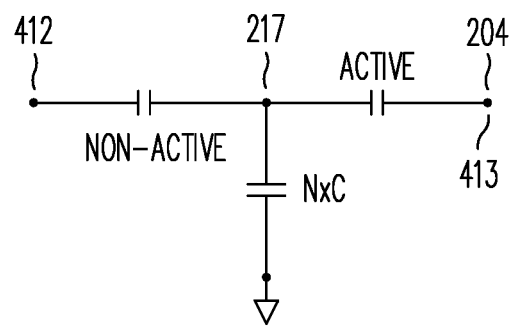
FIG. 16A is a model in which drain electrode 217 is shown capacitively coupled to (i) electrode 412, which represents word lines associated with an active source segment, and (ii) electrode 413, which represents word lines associated with all non-active source segments.
Figures 16B, 16C:
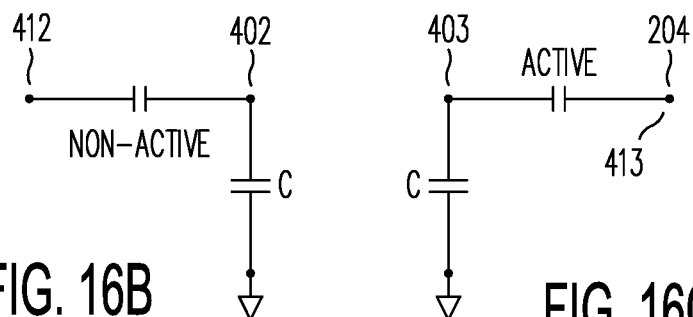
FIGS. 16B and 16C shows, for the case in which the source electrode is segmented into two segments, the portions of the model of FIG. 16A for drain electrode 217 coupled to an active segment and a non-active segment, respectively.
Figure 16D:
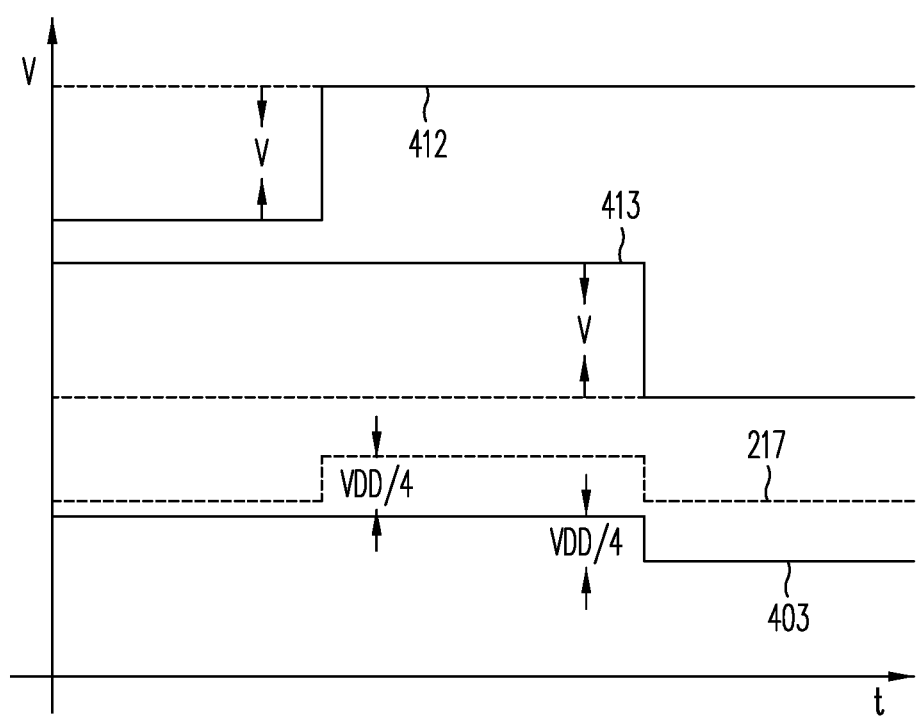
FIG. 16D shows the voltage waveforms at source segments 412 and 413, drain electrode 217 and partial drain electrode 403 in the models of FIGS. 16A-16C.

Signals of word lines, when applied anywhere along a drain layer or a bit line, couple the full drain layer and the source segment associated with the word lines ("active source segment"), but not to other source segments ("non-active source segments"). FIG. 16A is a model in which drain electrode 217 is shown capacitively coupled to (i) electrode 412, which represents word lines coupled to the active source segment, and (ii) electrode 413, which represents word lines coupled to the non-active source segments. For the case in which the source layer is segmented into two source segments, FIGS. 16B and 16C show the portions of the model of FIG. 16A for drain electrode 217 coupled to an active segment and a non-active segment, respectively. To illustrate the individual capacitive couplings by non-active source segment 412 and active segment 413, the induced voltages to drain electrode 217 are represented by nodes 402 and 403, respectively. The voltage waveforms at non-active and active source segments 412 and 413, respectively, drain electrode 217 and partial drain electrode 403 in the models of FIGS. 16A-16C are shown in FIG. 16D. As shown in FIG. 16D, a step-up word line signal at the word lines associated with non-active source segment 412 couples both non-active source segment 412 and common drain electrode 217 and does not couple active source segment 413. Subsequently, a step-down word line signal couples both associated active source segment 413 and common drain electrode 217 and does not couple non-active source segment 412. At the step-down signal, the voltage at common drain electrode 217 returns to its initial value (i.e., the value before the step-up at non-active source segment 412). Accordingly, a technique of inducing independent voltages on the drain and source electrodes can be provided, so long as the source layer is segmented and the drain layer is connected to the sense amplifier in a diode-like connection (i.e. unidirectional).

In the diode-like connection approach, the charge-up current in the drain layer, as seen from sense amplifier 255, reduces asymptotically in time (see, FIG. 13C). To avoid a spurious sensing signal, a recovery interval is required, as discussed above. One way to avoid a long set-up time is to provide a positive "step-up" drain voltage, which effectively reverse-biases the diode connection, thus preventing the unidirectional current flow from input electrode 251 of sense amplifier 255 to drain electrode 217. Such a voltage increase may be achieved with ease and controlled accurately through step-up signals carried out in the associated word lines.

Figure 17:
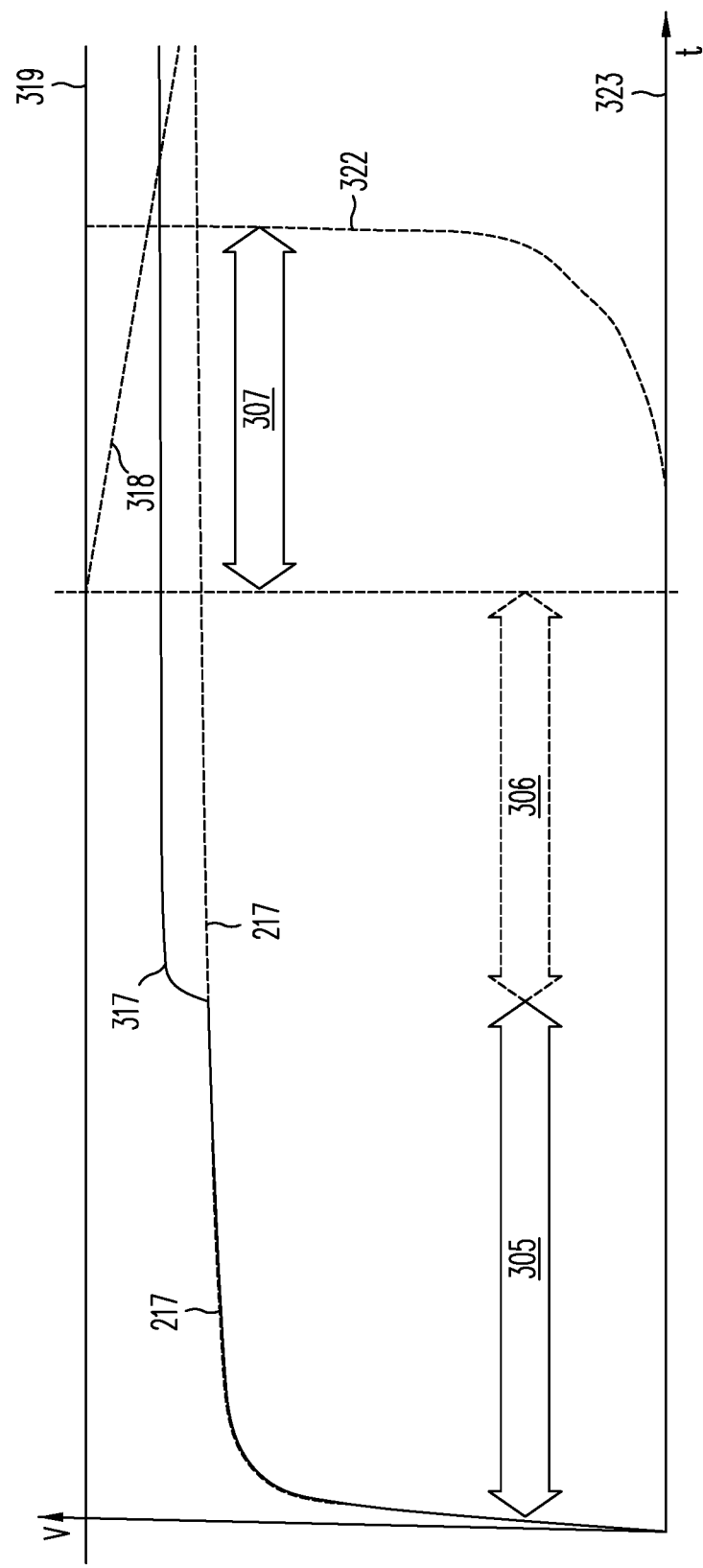
FIG. 17 illustrates the effect of a voltage "step-up" step at drain electrode 217, following isolation of source electrode 219 from drain electrode 217.

FIG. 17 illustrates the effect of a step-up voltage at drain electrode 217, following isolation of source electrode 219 from drain electrode 217. As shown in FIG. 17, after equalization interval 305—during which drain electrode 217 and source electrode 219 are equalized—the voltage at drain electrode 217 is boosted with a positive step-up voltage indicated by waveform segment 317. As a result, the drain charge-up current through string selection transistor 230 is effectively stopped. Without the step-up voltage, drain electrode 217 continuously charges-up (indicated by the dotted portion of line segment 217) over recovery interval 306, after which current leakage occurs, as indicated by dotted waveform segment 318. In that case, after sensing interval 307, a spurious transition in the output state of the sense amplifier (indicated by waveform segment 322) may occur. However, with the step-up voltage of waveform segment 317, the voltage at input electrode 251 of sense amplifier 255 (waveform segment 319) remains high, thus preventing a false transition in the output state 323 of the sense amplifier from being triggered.

Figure 18:
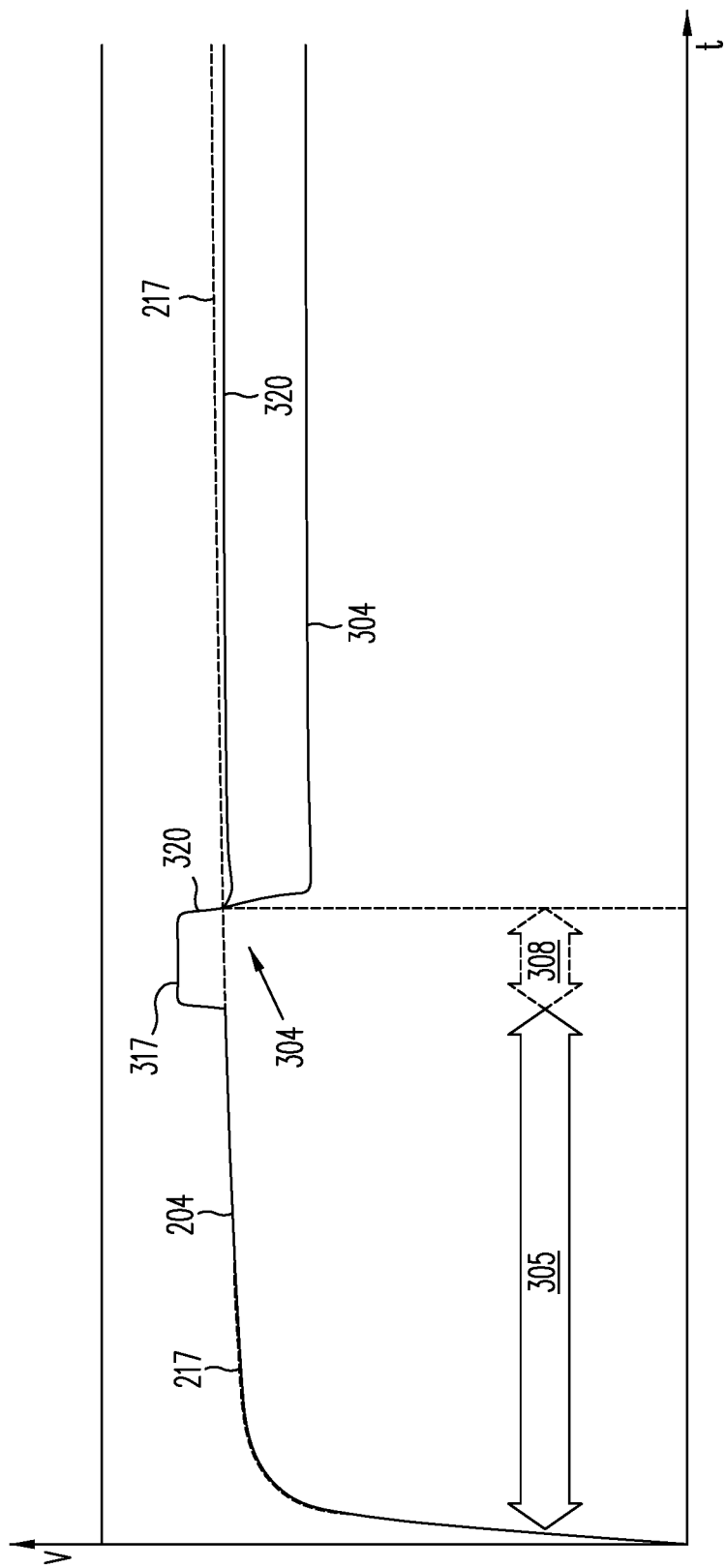
FIG. 18 illustrates the effect of a positive pulse, rather than the step-up voltage of FIG. 17, at drain electrode 217, following isolation of source electrode 219 from drain electrode 217.

FIG. 18 illustrates the effect of a positive pulse at drain electrode 217, rather than the step-up voltage of FIG. 17, following isolation of the active source segment from drain electrode 217. As shown in FIG. 18, after predetermined time interval 308 that follows the step-up voltage at the end of equalization interval 305, a word line signal couples down the voltage at drain electrode 217 to the voltage level indicated by waveform segment 320 (i.e., substantially returning the voltage at drain electrode 217 to the value before the voltage pulse). At the expiration of time interval 305, source electrode 219 is electrically isolated from drain electrode 217. The voltage at source electrode 219 at that time is indicated by voltage level 304. Because of the reverse-bias across the drain junction in string selection transistor 230, no undesirable glitch is induced at drain electrode 217 by the voltage step-down at the end of interval 308. The voltage step-down at drain 217 is carried out simultaneously as the voltage step-down by the active source segment, bringing the voltage at the active source segment to level 304.

The voltage pulse at drain 217 over time interval 308 may be achieved by a voltage pulse in corresponding word line coupling signals. So long as the voltage pulse in the word lines start from and returns to the same voltage level, the induced voltage pulse at drain 217 would also start from and return to at a same voltage, the amplitude of the induced pulse depends upon the coupling ratio between the capacitances between drain electrode 217 and the corresponding word lines. Thus, the pulse amplitude can be controlled by the number of word lines participating. Pulses of different shapes (e.g., the shape of waveform segments 304 and 320) can be created by applying piecewise signals on word lines adjacent the active source segment relative to word lines adjacent non-active source segments, as all signals couple the drain electrode, while only word line signals at the active source segment couple both the drain electrode and the active source segment.

The input electrode of the sense amplifier may be released—thereby enabling sensing—immediately after the step-up voltage at the expiration of time interval 305, although sensing is not effectuated until after time interval 308, because of the diode-like, unidirectional connection.

The method of data sensing that couples down only source electrode 219—but not drain electrode 217—prevents the undesirable glitch at drain electrode 217, thus avoiding having to impose a recovery time. Also, by adjusting the number of word lines participating, the voltage at drain electrode 217 may be fine-tuned (e.g., so that a slightly higher voltage than started may result). A slightly higher final voltage at drain electrode 217 is equivalent to a small "step-up" voltage, effectively preventing the drain charge-up current. Also, stepping down the voltage at source electrode 219 (relative to the voltage at drain electrode 217) should involve only word lines associated with the active source segment, thereby reducing leakage current.

Another advantage of a drain voltage pulse is the synchronization of source/drain separation to current leakage and to potential memory cell conduction: a memory cell can be read (i.e. turned ON) before voltage separation of the source and drain electrodes, thus canceling out any longer word line RC delays.

Figure 19:
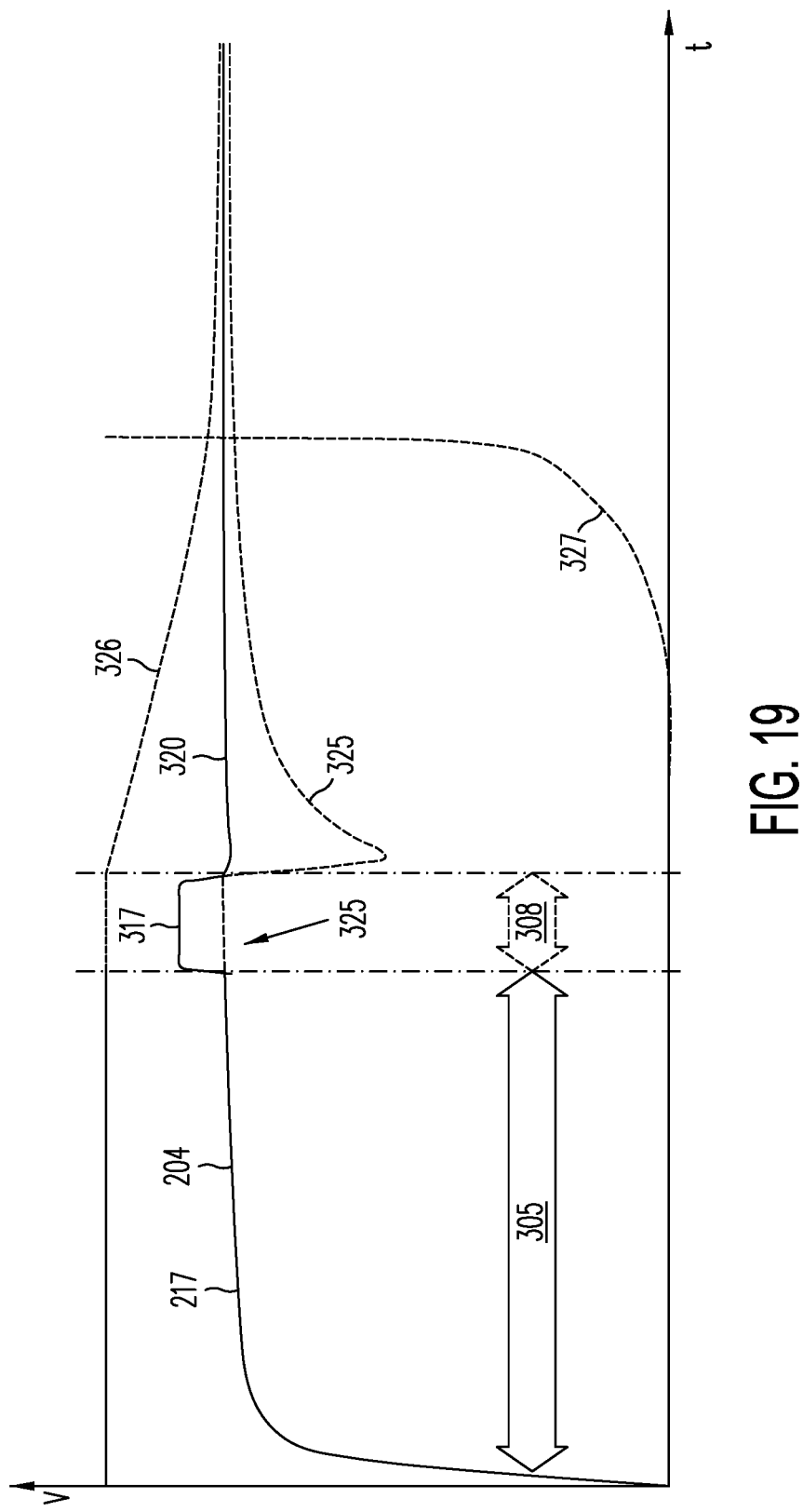
FIG. 19 illustrates waveforms of signals at a drain electrode, a segmented source electrode and an input electrode of a sense amplifier during a sensing sequence in which various word line-based capacitive coupling steps are carried out, taking advantage of the segmentation in the source electrode.

FIG. 19 illustrates waveforms of signals at drain electrode 217, a segmented source electrode and input electrode 251 of sense amplifier 255 during a sensing sequence in which various word line-based capacitive coupling steps are carried out, taking advantage of the segmentation in the source layer. As shown in FIG. 19, drain electrode 217 and the active source segment are initially both brought to voltage VDD–$V_{TN}$, using a technique such as that illustrated by FIGS. 12A-12C, and by setting a certain number of word lines of the active source segment at supply voltage VDD. Then, the active source segment is decoupled from drain electrode 217, followed by raising the same number of word lines associated with a non-active source segment to voltage VDD, thereby providing a step-up voltage (waveform segment 317) at drain electrode 217 without a corresponding voltage increase at the active source segment (waveform 325). As drain electrode 217 is common to all source segments, any word line along any source segment may be used to induce a voltage step-up or step-down at drain electrode 217. As a matter of fact, when the voltage at drain electrode 217 moves up, the active source segment couples up as well, but with no negative repercussion. After a minimum delay, the word lines associated with the active source segment are reset from voltage VDD to ground, returning drain electrode 217 back to the voltage prior to the step-up voltage (i.e., back to the voltage level indicated by waveform segment 320), while at the same time the active source segment is provided a step-down voltage to achieve a desired voltage separation between the active source segment and drain electrode 217. The voltage on active source segment is provided by waveform segment 325. Because the number of word lines associated with the active source segment moving down is equal to the number of word lines associated with the non-active source segment that moves up to produce the step-up voltage, drain electrode 217 returns to the voltage level before the step-up voltage. The active source segment, however, couples down according to the number of word lines associated with the active source segment are participating. All non-active source segment are preferably kept connected to drain electrode 217 to prevent leakage currents from the non-active source segments.

Sensing may be enabled during the voltage pulse, but the output state of the sense amplifier does not change, because of the reverse-biased junction in string selection transistor 230, which prevents a current flow between drain electrode 207 and input electrode 251 of sense amplifier 255. Also, before the falling edge of the pulse, the word lines for the voltage separation between drain electrode 217 and source electrode 219 are already selected. When the word lines associated with the active source segment are brought low, data sensing may start, with basically perfect synchronization between the voltage separation and memory cell current—if any—enabling charge sharing without earlier leakage current occurring.

FIG. 20 illustrates using the parasitic capacitance between two vertically adjacent NOR strings 501 and 502 to induce a coupled voltage step or pulse in one of the floating common source lines. In FIG. 20, common source line 219 of NOR string 501 is in close proximity of common bit line 220 of vertically adjacent NOR string 502. As common bit line 220 is electrically accessible through selection transistor 530, by applying a signal 540 through selection transistor 530 on common bit line 220, a coupled step or pulse signal can be induced on floating common source line 219.

The above detailed description is provided to illustrate specific embodiments of the present invention and is not intended to be limiting. Numerous variations and modifications within the scope of the invention are possible. The present invention is set forth in the following claims.

What is claimed is:

1. A method of reading a selected one of a first plurality of thin-film storage transistors within a NOR-type memory string, wherein the thin-film storage transistors share a common source line and a common bit line, and wherein each thin-film storage transistor further comprises a charge-storing layer and a gate electrode that is contacted by an associated word line, the method comprising:
   initializing the common bit line and the common source line to a predetermined voltage that is between a power supply voltage and ground;
   effectuating a voltage separation between the common bit line and the common source line by causing the common bit line, the common source line, or both, to deviate from the predetermined voltage, wherein the voltage separation is effectuated by a change in potential on the common source line as a result of capacitive coupling between the common source line and a conductor in the vicinity of the common source line;
   providing a read voltage on the gate terminal of the selected thin-film storage transistor through its associated word line, the read voltage being one that places the selected thin-film storage transistor in a conductive state when the charge in the charge-storing layer of the selected thin-film storage transistor corresponds to an amount associated with the read voltage; and
   in a sense circuit, based on sensing a flow of charge into or out of the common source line, determining whether the read voltage places the selected thin-film storage transistor in the conductive state.

2. The method of claim 1, wherein the conductor in the vicinity of the common source line being one of a predetermined set of the word lines associated with thin-film storage transistors in the NOR-type memory string.

3. The method of claim 1, wherein the predetermined voltage is substantially the power supply voltage or ground.

4. The method of claim 1, wherein the sense circuit determines the stored information based on a voltage on the common bit line after the flow of charge.

5. The method of claim 4, wherein the sense circuit detects whether or not the voltage on the common bit line crosses a discriminating level within a predetermined period of time after the read voltage is provided on the word line.

6. The method of claim 5, wherein the sense circuit detects whether or not the voltage on the common bit line crosses a discriminating level.

7. The method of claim 6, wherein the predetermined voltage substantially equals the power supply voltage, which is higher than the discriminating level.

8. The method of claim 6, wherein both the predetermined voltage and the voltage on the common bit line resulting from the flow of charge are both on the lower side of the discriminating level.

9. The method of claim 6, wherein the discriminating level is a PMOS threshold voltage below a power supply voltage.

10. The method of claim 1, wherein the sense circuit comprises an operational amplifier.

11. The method of claim 1, wherein the sense circuit comprises a differential amplifier.

12. The method of claim 1, wherein the sense circuit determines the stored information before the flow of charge settles, but after the voltage on the common bit line crosses a discriminating point.

13. The method of claim 1, wherein the predetermined voltage is substantially the power supply voltage less an NMOS transistor threshold voltage.

14. The method of claim 13, wherein a selection device connects an input terminal of the sense circuit in a unidirectional conduction mode with the common bit line.

15. A method of reading a selected one of a first plurality of thin-film storage transistors within a NOR-type memory string, wherein the thin-film storage transistors share a common source line and a common bit line, and wherein each thin-film storage transistor further comprises a charge-storing layer and a gate electrode that is contacted by an associated word line, the method comprising:
  initializing the common bit line and the common source line to a predetermined voltage that is between a power supply voltage and ground;
  effectuating a voltage separation between the common bit line and the common source line by causing the common bit line, the common source line, or both, to deviate from the predetermined voltage;
  providing a read voltage on the gate terminal of the selected thin-film storage transistor through its associated word line, the read voltage being one that places the selected thin-film storage transistor in a conductive state when the charge in the charge-storing layer of the selected thin-film storage transistor corresponds to an amount associated with the read voltage; and
  in a sense circuit, based on sensing a flow of charge into or out of the common source line, determining whether the read voltage places the selected thin-film storage transistor in the conductive state, wherein the common source line is electrically isolated from the power supply voltage or the ground except when a current path is enabled between the common bit line and the common source line, and wherein the common source line is initialized to the predetermined voltage by enabling the current path momentarily.

16. The method of claim 15, wherein the common source line is initialized to the predetermined voltage by a selection device or circuit electrically connecting the common bit line to the common source line.

17. A method of reading a selected one of a first plurality of thin-film storage transistors within a NOR-type memory string, wherein the thin-film storage transistors share a common source line and a common bit line, and wherein each thin-film storage transistor further comprises a charge-storing layer and a gate electrode that is contacted by an associated word line, the method comprising:
  initializing the common bit line and the common source line to a predetermined voltage that is between a power supply voltage and ground;
  effectuating a voltage separation between the common bit line and the common source line by causing the common bit line, the common source line, or both, to deviate from the predetermined voltage;
  providing a read voltage on the gate terminal of the selected thin-film storage transistor through its associated word line, the read voltage being one that places the selected thin-film storage transistor in a conductive state when the charge in the charge-storing layer of the selected thin-film storage transistor corresponds to an amount associated with the read voltage; and
  in a sense circuit, based on sensing a flow of charge into or out of the common source line, determining whether the read voltage places the selected thin-film storage transistor in the conductive state, wherein the flow of charge follows a predetermined recovery time after the change in potential in the common source line.

18. The method of claim 17, wherein the NOR-type memory string further comprises a second plurality of thin-film storage transistors, the second plurality of thin-film storage transistor sharing the common bit line with the first plurality of thin-film storage transistors, and wherein the second plurality of thin-film storage transistor share a common bit line that is electrically isolated from the common bit line of the first plurality of thin-film storage transistors.

19. The method of claim 18, wherein the change in potential is accomplished at least in part by changes in potential in the word lines associated with the second plurality of thin-film storage transistors.

20. The method of claim 19, wherein changes in potential in the word lines associated with the second plurality of thin-film storage transistors provide the voltage separation between the common source line of the selected thin-film storage transistor and the common bit line.

* * * * *